(12) United States Patent
Yu et al.

(10) Patent No.: US 11,468,933 B2
(45) Date of Patent: Oct. 11, 2022

(54) CONTENT ADDRESSABLE MEMORY, DATA PROCESSING METHOD, AND NETWORK DEVICE

(71) Applicant: HUAWEI TECHNOLOGIES CO., LTD., Guangdong (CN)

(72) Inventors: Jingzhou Yu, Beijing (CN); Linchun Wang, Beijing (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/156,938

(22) Filed: Jan. 25, 2021

(65) Prior Publication Data

US 2021/0142837 A1 May 13, 2021

Related U.S. Application Data

(63) Continuation of application No. PCT/CN2019/111238, filed on Oct. 15, 2019.

(30) Foreign Application Priority Data

Oct. 30, 2018 (CN) .......................... 201811281043.6

(51) Int. Cl.
*G11C 11/22* (2006.01)
*G11C 15/04* (2006.01)

(52) U.S. Cl.
CPC ...... *G11C 11/2273* (2013.01); *G11C 11/2255* (2013.01); *G11C 11/2275* (2013.01); *G11C 11/2297* (2013.01); *G11C 15/04* (2013.01)

(58) Field of Classification Search
CPC ............ G11C 11/2273; G11C 11/2297; G11C 11/2255; G11C 11/2275; G11C 15/04
(Continued)

(56) References Cited

U.S. PATENT DOCUMENTS 7,944,724 B2 5/2011 Chu
9,312,006 B2 4/2016 Chang et al.
(Continued)

FOREIGN PATENT DOCUMENTS

CN 1490880 A 4/2004
CN 101271728 A 9/2008
(Continued)

OTHER PUBLICATIONS

Xunzhao Yin et al., Exploiting Ferroelectric FETs for Low-Power Non-Volatile Logic-in-Memory Circuits. 2016 IEEE/ACM International Conference on Computer-Aided Design (ICCAD), Jan. 23, 2017, 8 pages.
(Continued)

*Primary Examiner* — Connie C Yoha
(74) *Attorney, Agent, or Firm* — Womble Bond Dickinson (US) LLP

(57) ABSTRACT

This application relates to the field of storage technologies and discloses a content addressable memory, a data processing method, and a network device, to resolve a problem that an existing CAM has a relatively large area, and consumes relatively large power. The CAM includes bit units of M rows and N columns, each bit unit includes a first FeFET and a second FeFET, a source of the first FeFET is connected to a drain of the second FeFET, a source of the second FeFET is grounded, bit cells of a same column correspond to a same match line, and a drain of a first FeFET in each bit cell of a same column is connected to a match line corresponding to the column. Bit cells of a same row correspond to a same first bit line and a same second bit line, a gate of a first FeFET in each bit cell of a same row is connected to a first bit line corresponding to the row, and a gate of a second FeFET in each bit cell of a same row is connected to a
(Continued)

second bit line corresponding to the row. The CAM may be applied to a network device such as a router.

20 Claims, 9 Drawing Sheets

(58) Field of Classification Search
USPC ........................................................ 365/49.1
See application file for complete search history.

(56) References Cited

U.S. PATENT DOCUMENTS

| | | | |
|---|---|---|---|
| 10,453,531 B1 * | 10/2019 | Petti | ........................ G11C 5/025 |
| 2003/0206466 A1 | 11/2003 | Aikawa | |
| 2006/0028247 A1 | 2/2006 | Hara et al. | |
| 2007/0002608 A1 | 1/2007 | Hsu et al. | |
| 2008/0055961 A1 | 3/2008 | Koide | |
| 2009/0201709 A1 | 8/2009 | Inoue | |
| 2011/0051483 A1 | 3/2011 | Chang et al. | |
| 2014/0347933 A1 | 11/2014 | Lee | |
| 2019/0325963 A1 * | 10/2019 | Noack | .................. G11C 15/046 |
| 2021/0343341 A1 * | 11/2021 | Strachan | ............... G11C 11/223 |

FOREIGN PATENT DOCUMENTS

| | | |
|---|---|---|
| CN | 101501780 A | 8/2009 |
| CN | 102341863 A | 2/2012 |
| CN | 105099918 A | 11/2015 |
| CN | 108447909 A | 8/2018 |

OTHER PUBLICATIONS

Xiaoming Chen et al., Design and optimization of FeFET-based crossbars for binary convolution neural networks. 2018 Design, Automation and Test in Europe Conference and Exhibition (DATE), Apr. 23, 2018, 6 pages.

Joe Brewer et al.,"Nonvolatile Memory Technologies With Emphasis on Flash",IEEE Press Series on Microelectronic Systems, Jan. 1, 2008(Jan. 1, 2008) total:24pages.

* cited by examiner

CONTENT ADDRESSABLE MEMORY, DATA PROCESSING METHOD, AND NETWORK DEVICE

CROSS-REFERENCE TO RELATED APPLICATIONS

This application is a continuation of International Application No. PCT/CN2019/111238, filed on Oct. 15, 2019, which claims priority to Chinese Patent Application No. 201811281043.6, filed on Oct. 30, 2018. The disclosures of the aforementioned applications are hereby incorporated by reference in their entireties.

TECHNICAL FIELD

This application relates to the field of storage technologies, and in particular, to a content addressable memory, a data processing method, and a network device.

BACKGROUND

A content addressable memory (CAM) is an important physical component of a network device. A typical CAM is a ternary content addressable memory (TCAM), mainly used to quickly search for an entry of an access control list (ACL), a routing table, or the like.

As shown in FIG. 1, in a conventional TCAM based on a metal-oxide semiconductor (MOS) field effect transistor, each bit cell includes 16 transistors (T), 12 Ts are used to store values and masks, and 4 Ts are used for comparison. A search line (SL) is used to input a match value (key), and a match line (ML) is used to return a match result. Each row in the conventional TCAM array represents one entry. During data search, an ML of each row is first charged to a high potential. A bit of a key is input by using an SL of each column, and a value of the bit is compared with a value in a TCAM entry. Matching is performed for all entries. If all bits in a row successfully match, an ML remains at a high potential. If there is any bit that does not match in the row, the ML of the row leaks to a low level. A match result is determined by determining whether the ML has a high potential or a low potential.

Because 16 Ts are needed for each bit cell in the conventional TCAM based on a MOS field effect transistor, an area of the TCAM is large. Consequently, power consumption of the TCAM is relatively high because a larger-sized TCAM has higher power consumption.

SUMMARY

Embodiments of this application provide a content addressable memory, a data processing method, and a network device, to reduce a size of a CAM, thereby reducing power consumption of the CAM.

According to a first aspect, an embodiment of the application provides a content addressable memory CAM, including bit cells of M rows and N columns, where both M and N are positive integers greater than or equal to 1. Each bit cell includes a first ferro-electric field effect transistor (FeFET) and a second FeFET. A source of the first FeFET is connected to a drain of the second FeFET, and a source of the second FeFET is grounded.

A CAM generally includes bit cells of a plurality of rows and a plurality of columns. One entry may include data stored in bit cells of one row in the CAM, or one entry may include data stored in bit cells of one column in the CAM. The CAM has different structures in the two manners.

Structure 1: One entry includes data stored in bit cells of one column in the CAM. In this case, bit cells of a same column correspond to a same match line, a drain of a first FeFET in each bit cell of a same column is connected to a match line corresponding to the column, bit cells of a same row correspond to a same first bit line and a same second bit line, a gate of a first FeFET in each bit cell of a same row is connected to a first bit line corresponding to the row, and a gate of a second FeFET in each bit cell of a same row is connected to a second bit line corresponding to the row.

Structure 2: One entry includes data stored in bit cells of one row in the CAM. In this case, bit cells of a same row correspond to a same match line, a drain of a first FeFET in each bit cell of a same row is connected to a match line corresponding to the row, bit cells of a same column correspond to a same first bit line and a same second bit line, a gate of a first FeFET in each bit cell of a same column is connected to a first bit line corresponding to the column, and a gate of a second FeFET in each bit cell of a same column is connected to a second bit line corresponding to the column.

It should be noted that bit cells of one column in the structure 1 are equivalent to bit cells of one row in the structure 2, and bit cells of one row in the structure 1 are equivalent to bit cells of one column in the structure 2. Therefore, the structure 1 and the structure 2 are substantially the same. An embodiment of the application elaborates the two structures. It may be understood that, even if only the structure 1 is used as an example for description, one of ordinary skilled in the art may obtain, based on related descriptions of the structure 1, a CAM of the structure 2 and a method for implementing data processing by using the CAM.

In an embodiment, for the structure 1, when one entry includes data stored in bit cells of one column in the CAM, bit cells of a same column separately correspond to a same first back gate line and a same second back gate line, a back gate of a first FeFET in each bit cell of a same column is connected to a first back gate line corresponding to the column, and a back gate of a second FeFET in each bit cell of a same column is connected to a second back gate line corresponding to the column. For the structure 2, when one entry includes data stored in bit cells of one row in the CAM, bit cells of a same row separately correspond to a same first back gate line and a same second back gate line, a back gate of a first FeFET in each bit cell of a same row is connected to a first back gate line corresponding to the row, and a back gate of a second FeFET in each bit cell of a same row is connected to a second back gate line corresponding to the row.

In the CAM provided in an embodiment of the application, each bit cell includes only two FeFET transistors. In the prior art, each bit cell includes 16 transistors. By comparison, an area of the CAM provided in an embodiment of the application is greatly reduced, thereby reducing power consumption of the CAM.

According to a second aspect, a data processing method is provided, and is applied to the CAM provided in any one of the first aspect and an embodiment of the first aspect. The method includes the following:

For a CAM shown in a structure 1, when one entry includes data stored in bit cells of one column in the CAM, a first FeFET and/or a second FeFET in each bit cell is set to be always cut off. Voltages of drains that are of first FeFETs and connected to match lines in the CAM are set as preset voltages, where preset voltages corresponding to different match lines are the same or different. A match value is input by using a first bit line and a reverse value of the match value is input by using a second bit line, or a match value is input by using the second bit line and a reverse value of the match value is input by using the first bit line. If an output voltage of a match line of a target column remains as a preset voltage corresponding to the target column, it is determined that an entry including data stored in bit cells of the target column is a match entry.

For a CAM shown in a structure 2, when one entry includes data stored in bit cells of one row in the CAM, a first FeFET and/or a second FeFET in each bit cell is set to be always cut off. Voltages of drains that are of first FeFETs and connected to match lines in the CAM are set as preset voltages, where preset voltages corresponding to different match lines are the same or different. A match value is input by using a first bit line and a reverse value of the match value is input by using a second bit line, or a match value is input by using the second bit line and a reverse value of the match value is input by using the first bit line. If an output voltage of a match line of a target row remains as the preset voltage corresponding to the target row, it is determined that an entry including data stored in bit cells of the target row is a match entry.

In an embodiment, for both the CAM shown in the structure 1 and the CAM shown in the structure 2, if a FeFET in the CAM includes a gate but does not include a back gate, a first FeFET and/or a second FeFET in each bit cell may be set, in the following manner, to be always cut off: setting a voltage of a gate that is of the first FeFET and connected to the first bit line and/or a voltage of a gate that is of the second FeFET and connected to the second bit line in each bit cell to fall within a first voltage range, so that the first FeFET and/or the second FeFET is always cut off. When a voltage of the gate of the FeFET falls within the first voltage range, the FeFET is cut off.

Correspondingly, the following manner may be used to implement the case in which a match value is input by using a first bit line and a reverse value of the match value is input by using a second bit line, or a match value is input by using the second bit line and a reverse value of the match value is input by using the first bit line: setting a voltage of a gate that is of the first FeFET and connected to the first bit line as a first voltage, and setting a voltage of a gate that is of the second FeFET and connected to the second bit line as a second voltage, to input a match value by using the first bit line and input a reverse value of the match value by using the second bit line, or input a match value by using the second bit line and input a reverse value of the match value by using the first bit line.

In an embodiment, for both the CAM shown in the structure 1 and the CAM shown in the structure 2, if the FeFET includes a gate and a back gate, a first FeFET and/or a second FeFET in each bit cell may be set, in the following manner, to be always cut off: setting a voltage difference between a gate that is of the first FeFET and connected to the first bit line and a back gate of the first FeFET in each bit cell to fall within a first voltage range, and/or setting a voltage difference between a gate that is of the second FeFET and connected to the second bit line and a back gate of the second FeFET in each bit cell to fall within the first voltage range, so that the first FeFET and/or the second FeFET is always cut off. When a voltage difference between the gate and the back gate of the FeFET falls within the first voltage range, the FeFET is cut off.

Correspondingly, the following manner may be used to implement the case in which a match value is input by using a first bit line and a reverse value of the match value is input by using a second bit line, or a match value is input by using the second bit line and a reverse value of the match value is input by using the first bit line: setting a voltage difference between a gate that is of the first FeFET and connected to the first bit line and a back gate of the first FeFET as a first voltage, and setting a voltage difference between a gate that is of the second FeFET and connected to the second bit line and a back gate of the second FeFET as a second voltage, to input a match value by using the first bit line and input a reverse value of the match value by using the second bit line, or input a match value by using the second bit line and input a reverse value of the match value by using the first bit line.

For example, if a match value is input by using the first bit line, when the match value is 0, the first voltage falls within a second voltage range, and the second voltage falls within a third voltage range; or when the match value is 1, the first voltage falls within a third voltage range, and the second voltage falls within a second voltage range. If a match value is input by using the second bit line, when the match value is 0, the first voltage falls within a third voltage range, and the second voltage falls within a second voltage range; or when the match value is 1, the first voltage falls within a second voltage range, and the second voltage falls within a third voltage range.

If a FeFET includes a gate but does not include a back gate, when a voltage of the gate falls within the second voltage range, a match value is input into the FeFET for matching; or when a voltage of the gate falls within the third voltage range, the FeFET is always conducted. Alternatively, if a FeFET includes a gate and a back gate, when a voltage difference between the gate and the back gate falls within the second voltage range, a match value is input into the FeFET for matching; or when a voltage difference between the gate and the back gate falls within the third voltage range, the FeFET is always conducted.

In an embodiment, if at least two match entries exist, a match entry with a smallest storage address is output as a match result.

Alternatively, for the CAM shown in the structure 1, when one entry includes data stored in bit cells of one column in the CAM, if at least two match entries exist, an entry including data stored in bit cells of a target column with a smallest column number is output as a match result.

Alternatively, for the CAM shown in the structure 2, when one entry includes data stored in bit cells of one row in the CAM, if at least two match entries exist, an entry including data stored in bit cells of a target row with a smallest row number is output as a match result.

An embodiment of this application provides a method for implementing data matching by using the CAM provided in any one of the first aspect and an embodiment of the first aspect. Each bit cell in the CAM includes only two FeFET transistors. In this method, a match value is input by using a bit line connected to a gate, and a match result is output by using a match line connected to a drain. Compared with a matching method in the prior art, the method can reduce matching power consumption because the CAM includes only two FeFET transistors, and a size of the CAM is relatively small.

In an embodiment, an embodiment of this application further provides a method for writing data into a CAM. For example, when an entry matching manner is exact match or mask match and a mask of a bit cell is 1, different values are written into a first FeFET and a second FeFET during writing data into the bit cell. When an entry matching manner is mask match and a mask of a bit cell is 0, 0 is written into both a first FeFET and a second FeFET during writing data into the bit cell.

In an embodiment, the FeFET includes a gate and a back gate. In this case, during writing data into the bit cell, different values may be written into the first FeFET and the second FeFET in the following manner: setting a voltage difference between a gate that is of the first FeFET and connected to the first bit line and a back gate of the first FeFET to fall within a fourth voltage range, and setting a voltage difference between a gate that is of the second FeFET and connected to the second bit line and a back gate of the second FeFET to fall within a fifth voltage range, so that different values are written into the first FeFET and the second FeFET. The fourth voltage range and the fifth voltage range are different. Likewise, 0 may be written into both the first FeFET and the second FeFET in the following manner: setting a voltage difference between a gate that is of the first FeFET and connected to the first bit line and a back gate of the first FeFET and a voltage difference between a gate that is of the second FeFET and connected to the second bit line and a back gate of the second FeFET to fall within a same voltage range, so that values written into the first FeFET and the second FeFET are 0.

In an embodiment, if the FeFET includes a gate but does not include a back gate, different values may be written into the first FeFET and the second FeFET in the following manner: setting a voltage of a gate that is of the first FeFET and connected to the first bit line to fall within a fourth voltage range, and setting a voltage of a gate that is of the second FeFET and connected to the second bit line to fall within a fifth voltage range, so that different values are written into the first FeFET and the second FeFET. The fourth voltage range and the fifth voltage range are different. 0 may be written into both the first FeFET and the second FeFET in the following manner: setting a voltage of a gate that is of the first FeFET and connected to the first bit line and a gate that is of the second FeFET and connected to the second bit line to fall within a same voltage range, so that values written into the first FeFET and the second FeFET are 0.

In an embodiment, an embodiment of this application further provides a method for writing data into a bit cell in a CAM.

If a FeFET includes a gate and a back gate, for a CAM shown in a structure 1, when one entry includes data stored in bit cells of one column in the CAM, during writing data into a bit cell of an $X^{th}$ row and a $Y^{th}$ column in the CAM, a voltage of a gate that is of a first FeFET and connected to the first bit line of the $X^{th}$ row is set as a first write voltage, a voltage of a gate that is of a second FeFET and connected to the second bit line of the $X^{th}$ row is set as a second write voltage, a voltage of a gate that is of a first FeFET and connected to a first bit line of another row is set as a third write voltage, and a voltage of a gate that is of a second FeFET and connected to a second bit line of the another rows is set as a fourth write voltage. A voltage of a back gate that is of a first FeFET and connected to a first back gate line of the $Y^{th}$ column is set as a fifth write voltage, a voltage of a back gate that is of a second FeFET and connected to a second back gate line of the $Y^{th}$ column is set as a sixth write voltage, a voltage of a back gate that is of a first FeFET and connected to a first back gate line of another column is set as a seventh write voltage, and a voltage of a back gate that is of a second FeFET and connected to a second back gate line of the another columns is set as an eighth write voltage.

If a FeFET includes a gate and a back gate, for a CAM shown in a structure 2, when one entry includes data stored in bit cells of one row in the CAM, during writing data into a bit cell of an $X^{th}$ row and a $Y^{th}$ column in the CAM, a voltage of a gate that is of a first FeFET and connected to the first bit line of the $X^{th}$ row is set as a first write voltage, a voltage of a gate that is of a second FeFET and connected to the second bit line of the $X^{th}$ row is set as a second write voltage, a voltage of a gate that is of a first FeFET and connected to a first bit line of another row is set as a third write voltage, and a voltage of a gate that is of a second FeFET and connected to a second bit line of the another rows is set as a fourth write voltage. A voltage of a back gate that is of a first FeFET and connected to a first back gate line of the $Y^{th}$ column is set as a fifth write voltage, a voltage of a back gate that is of a second FeFET and connected to a second back gate line of the $Y^{th}$ column is set as a sixth write voltage, a voltage of a back gate that is of a first FeFET and connected to a first back gate line of another column is set as a seventh write voltage, and a voltage of a back gate that is of a second FeFET and connected to a second back gate line of the another columns is set as an eighth write voltage.

For example, a difference between the first write voltage and the fifth write voltage falls within the fourth voltage range, and a difference between the second write voltage and the sixth write voltage falls within the fifth voltage range, so that data is written only into the bit cell of the $X^{th}$ row and the $Y^{th}$ column; and a difference between the third write voltage and the fifth write voltage, a difference between the fourth write voltage and the sixth write voltage, a difference between the third write voltage and the seventh write voltage, a difference between the fourth write voltage and the eighth write voltage, a difference between the first write voltage and the seventh write voltage, and a difference between the second write voltage and the eighth write voltage fall within a sixth voltage range, so that no data is written into another bit cell.

If the FeFET includes a gate but does not include a back gate, for a CAM shown in a structure 1, when one entry includes data stored in bit cells of one column in the CAM, a switch is disposed between a gate of a first FeFET in each bit cell and a connected first bit line, and a switch is disposed between a gate of a second FeFET in each bit cell and a connected second bit line. During writing data into a bit cell of the $X^{th}$ row and the $Y^{th}$ column in the CAM, a switch between a gate of a first FeFET in the bit cell of the $X^{th}$ row and the $Y^{th}$ column and a connected first bit line is set to be closed, and a switch between a gate of a second FeFET in the bit cell of the $X^{th}$ row and the $Y^{th}$ column and a connected second bit line is set to be closed. A switch between a gate of a first FeFET in another bit cell of the $X^{th}$ row and a connected first bit line are set to be open, and a switch between a gate of a second FeFET in the another bit cell of the $X^{th}$ row and a connected second bit line are set to be open. A voltage of a gate that is of a first FeFET and connected to the first bit line of the $X^{th}$ row is set as a first write voltage, a voltage of a gate that is of a second FeFET and connected to the second bit line of the $X^{th}$ row is set as a second write voltage, a voltage of a gate that is of a first FeFET and connected to a first bit line of another row is set as a third write voltage, and a voltage of a gate that is of a second FeFET and connected to a second bit line of the another row is set as a fourth write voltage. The first write voltage falls within a fourth voltage range, and the second write voltage falls within a fifth voltage range, so that data is written only into the bit cell of the $X^{th}$ row and the $Y^{th}$ column; and the third write voltage and the fourth write voltage fall within a sixth voltage range, so that no data is written into bit cells other than the bit cell of the $X^{th}$ row and the $Y^{th}$ column.

If the FeFET includes a gate but does not include a back gate, for a CAM shown in a structure 2, when one entry includes data stored in bit cells of one row in the CAM, a switch is disposed between a gate of a first FeFET in each bit cell and a connected first bit line, and a switch is disposed between a gate of a second FeFET in each bit cell and a connected second bit line. During writing data into a bit cell of the $X^{th}$ row and the $Y^{th}$ column in the CAM, a switch between a gate of a first FeFET in the bit cell of the $X^{th}$ row and the $Y^{th}$ column and a connected first bit line is set to be closed, and a switch between a gate of a second FeFET in the bit cell of the $X^{th}$ row and the $Y^{th}$ column and a connected second bit line is set to be closed. A switch between a gate of a first FeFET in another bit cell of the $X^{th}$ row and a connected first bit line is set to be open, and a switch between a gate of a second FeFET in the another bit cell of the $X^{th}$ row and a connected second bit line is set to be open. A voltage of a gate that is of a first FeFET and connected to the first bit line of the $X^{th}$ row is set as a first write voltage, and a voltage of a gate that is of a second FeFET and connected to the second bit line of the $X^{th}$ row is set as a second write voltage. A voltage of a gate that is of a first FeFET and connected to a first bit line of another row is set as a third write voltage, and a voltage of a gate that is of a second FeFET and connected to a second bit line of the another row is set as a fourth write voltage. The first write voltage falls within a fourth voltage range, and the second write voltage falls within a fifth voltage range, so that data is written only into the bit cell of the $X^{th}$ row and the $Y^{th}$ column; and the third write voltage and the fourth write voltage fall within a sixth voltage range, so that no data is written into bit cells other than the bit cell of the $X^{th}$ row and the $Y^{th}$ column.

An embodiment of this application provides a method for writing data into a CAM by using the CAM provided in any one of the first aspect and an embodiment of the first aspect. Each bit cell in the CAM includes only two FeFET transistors. In this method, a value is written by using a bit line connected to a gate. Compared with a data write method in the prior art, the method can reduce power consumption of writing data because the CAM includes only two FeFET transistors, and a size of the CAM is relatively small.

According to a third aspect, a data processing method is provided, and is applied to the CAM provided in any one of the first aspect and an embodiment of the first aspect. The method includes: when an entry matching manner is exact match or mask match and a mask of a bit cell is 1, writing different values into a first FeFET and a second FeFET during writing data into the bit cell; or when an entry matching manner is mask match and a mask of a bit cell is 0, writing 0 into both a first FeFET and a second FeFET during writing data into the bit cell.

In an embodiment, the FeFET includes a gate and a back gate. In this case, during writing data into the bit cell, different values may be written into the first FeFET and the second FeFET in the following manner: setting a voltage difference between a gate that is of the first FeFET and connected to the first bit line and a back gate of the first FeFET to fall within a fourth voltage range, and setting a voltage difference between a gate that is of the second FeFET and connected to the second bit line and a back gate of the second FeFET to fall within a fifth voltage range, so that different values are written into the first FeFET and the second FeFET. The fourth voltage range and the fifth voltage range are different. Likewise, 0 may be written into both the first FeFET and the second FeFET in the following manner: setting a voltage difference between a gate that is of the first FeFET and connected to the first bit line and a back gate of the first FeFET and a voltage difference between a gate that is of the second FeFET and connected to the second bit line and a back gate of the second FeFET to fall within a same voltage range, so that values written into the first FeFET and the second FeFET are 0.

In an embodiment, the FeFET includes a gate but does not include a back gate. In this case, different values may be written into the first FeFET and the second FeFET in the following manner: setting a voltage of a gate that is of the first FeFET and connected to the first bit line to fall within a fourth voltage range, and setting a voltage of a gate that is of the second FeFET and connected to the second bit line to fall within a fifth voltage range, so that different values are written into the first FeFET and the second FeFET. The fourth voltage range and the fifth voltage range are different. 0 may be written into both the first FeFET and the second FeFET in the following manner: setting a voltage of a gate that is of the first FeFET and connected to the first bit line and a gate that is of the second FeFET and connected to the second bit line to fall within a same voltage range, so that values written into the first FeFET and the second FeFET are 0.

In an embodiment, an embodiment of this application further provides a method for writing data into a bit cell in a CAM.

If a FeFET includes a gate and a back gate, for a CAM shown in a structure 1, when one entry includes data stored in bit cells of one column in the CAM, during writing data into a bit cell of an $X^{th}$ row and a $Y^{th}$ column in the CAM, a voltage of a gate that is of a first FeFET and connected to the first bit line of the $X^{th}$ row is set as a first write voltage, a voltage of a gate that is of a second FeFET and connected to the second bit line of the $X^{th}$ row is set as a second write voltage, a voltage of a gate that is of a first FeFET and connected to a first bit line of another row is set as a third write voltage, and a voltage of a gate that is of a second FeFET and connected to a second bit line of the another rows is set as a fourth write voltage. A voltage of a back gate that is of a first FeFET and connected to a first back gate line of the $Y^{th}$ column is set as a fifth write voltage, a voltage of a back gate that is of a second FeFET and connected to a second back gate line of the $Y^{th}$ column is set as a sixth write voltage, a voltage of a back gate that is of a first FeFET and connected to a first back gate line of another column is set as a seventh write voltage, and a voltage of a back gate that is of a second FeFET and connected to a second back gate line of the another columns is set as an eighth write voltage.

If a FeFET includes a gate and a back gate, for a CAM shown in a structure 2, when one entry includes data stored in bit cells of one row in the CAM, during writing data into a bit cell of an $X^{th}$ row and a $Y^{th}$ column in the CAM, a voltage of a gate that is of a first FeFET and connected to the first bit line of the $X^{th}$ row is set as a first write voltage, a voltage of a gate that is of a second FeFET and connected to the second bit line of the $X^{th}$ row is set as a second write voltage, a voltage of a gate that is of a first FeFET and connected to a first bit line of another row is set as a third write voltage, and a voltage of a gate that is of a second FeFET and connected to a second bit line of the another rows is set as a fourth write voltage. A voltage of a back gate that is of a first FeFET and connected to a first back gate line of the $Y^{th}$ column is set as a fifth write voltage, a voltage of a back gate that is of a second FeFET and connected to a second back gate line of the $Y^{th}$ column is set as a sixth write voltage, a voltage of a back gate that is of a first FeFET and connected to a first back gate line of another column is set as a seventh write voltage, and a voltage of a back gate that is of a second FeFET and connected to a second back gate line of the another columns is set as an eighth write voltage.

For example, a difference between the first write voltage and the fifth write voltage falls within the fourth voltage range, and a difference between the second write voltage and the sixth write voltage falls within the fifth voltage range, so that data is written only into the bit cell of the $X^{th}$ row and the $Y^{th}$ column; and a difference between the third write voltage and the fifth write voltage, a difference between the fourth write voltage and the sixth write voltage, a difference between the third write voltage and the seventh write voltage, a difference between the fourth write voltage and the eighth write voltage, a difference between the first write voltage and the seventh write voltage, and a difference between the second write voltage and the eighth write voltage fall within a sixth voltage range, so that no data is written into another bit cell.

If the FeFET includes a gate but does not include a back gate, for a CAM shown in a structure 1, when one entry includes data stored in bit cells of one column in the CAM, a switch is disposed between a gate of a first FeFET in each bit cell and a connected first bit line, and a switch is disposed between a gate of a second FeFET in each bit cell and a connected second bit line. During writing data into a bit cell of the $X^{th}$ row and the $Y^{th}$ column in the CAM, a switch between a gate of a first FeFET in the bit cell of the $X^{th}$ row and the $Y^{th}$ column and a connected first bit line is set to be closed, and a switch between a gate of a second FeFET in the bit cell of the $X^{th}$ row and the $Y^{th}$ column and a connected second bit line is set to be closed. A switch between a gate of a first FeFET in another bit cell of the $X^{th}$ row and a connected first bit line is set to be open, and a switch between a gate of a second FeFET in the another bit cell of the $X^{th}$ row and a connected second bit line is set to be open. A voltage of a gate that is of a first FeFET and connected to the first bit line of the $X^{th}$ row is set as a first write voltage, a voltage of a gate that is of a second FeFET and connected to the second bit line of the $X^{th}$ row is set as a second write voltage, a voltage of a gate that is of a first FeFET and connected to a first bit line of another row is set as a third write voltage, and a voltage of a gate that is of a second FeFET and connected to a second bit line of the another row is set as a fourth write voltage. The first write voltage falls within a fourth voltage range, and the second write voltage falls within a fifth voltage range, so that data is written only into the bit cell of the $X^{th}$ row and the $Y^{th}$ column; and the third write voltage and the fourth write voltage fall within a sixth voltage range, so that no data is written into bit cells other than the bit cell of the $X^{th}$ row and the $Y^{th}$ column.

If the FeFET includes a gate but does not include a back gate, for a CAM shown in a structure 2, when one entry includes data stored in bit cells of one row in the CAM, a switch is disposed between a gate of a first FeFET in each bit cell and a connected first bit line, and a switch is disposed between a gate of a second FeFET in each bit cell and a connected second bit line. During writing data into a bit cell of the $X^{th}$ row and the $Y^{th}$ column in the CAM, a switch between a gate of a first FeFET in the bit cell of the $X^{th}$ row and the $Y^{th}$ column and a connected first bit line is set to be closed, and a switch between a gate of a second FeFET in the bit cell of the $X^{th}$ row and the $Y^{th}$ column and a connected second bit line is set to be closed. A switch between a gate of a first FeFET in another bit cell of the $X^{th}$ row and a connected first bit line is set to be open, and a switch between a gate of a second FeFET in the another bit cell of the $X^{th}$ row and a connected second bit line is set to be open. A voltage of a gate that is of a first FeFET and connected to the first bit line of the $X^{th}$ row is set as a first write voltage, a voltage of a gate that is of a second FeFET and connected to the second bit line of the $X^{th}$ row is set as a second write voltage. A voltage of a gate that is of a first FeFET and connected to a first bit line of another row is set as a third write voltage, and a voltage of a gate that is of a second FeFET and connected to a second bit line of the another row is set as a fourth write voltage. The first write voltage falls within a fourth voltage range, and the second write voltage falls within a fifth voltage range, so that data is written only into the bit cell of the $X^{th}$ row and the $Y^{th}$ column; and the third write voltage and the fourth write voltage fall within a sixth voltage range, so that no data is written into bit cells other than the bit cell of the $X^{th}$ row and the $Y^{th}$ column.

An embodiment of this application provides a method for writing data into a CAM by using the CAM provided in any one of the first aspect and embodiments of the first aspect. Each bit cell in the CAM includes only two FeFET transistors. In this method, a value is written by using a bit line connected to a gate. Compared with a data write method in the prior art, the method can reduce power consumption of writing data because the CAM includes only two FeFET transistors, and a size of the CAM is relatively small.

In an embodiment, an embodiment of this application further provides a method for performing data matching by using a CAM shown in a structure 1 or a structure 2. For the CAM shown in the structure 1, when one entry includes data stored in bit bit cells of one column in the CAM, a first FeFET and/or a second FeFET in each bit cell is set to be always cut off. Voltages of drains that are of first FeFETs and connected to match lines in the CAM are set as preset voltages, where preset voltages corresponding to different match lines are the same or different. A match value is input by using a first bit line and a reverse value of the match value is input by using a second bit line, or a match value is input by using the second bit line and a reverse value of the match value is input by using the first bit line. If an output voltage of a match line of a target column remains as a preset voltage corresponding to the target column, it is determined that an entry including data stored in bit cells of the target column is a match entry.

For the CAM shown in the structure 2, when one entry includes data stored in bit cells of one row in the CAM, a first FeFET and/or a second FeFET in each bit cell is set to be always cut off. Voltages of drains that are of first FeFETs and connected to match lines in the CAM are set as preset voltages, where preset voltages corresponding to different match lines are the same or different. A match value is input by using a first bit line and a reverse value of the match value is input by using a second bit line, or a match value is input by using the second bit line and a reverse value of the match value is input by using the first bit line. If an output voltage of a match line of a target row remains as the preset voltage corresponding to the target row, it is determined that an entry including data stored in bit cells of the target row is a match entry.

In an embodiment, for both the CAM shown in the structure 1 and the CAM shown in the structure 2, if a FeFET in the CAM includes a gate but does not include a back gate, a first FeFET and/or a second FeFET in each bit cell may be set, in the following manner, to be always cut off: setting a voltage of a gate that is of the first FeFET and connected to the first bit line and/or a voltage of a gate that is of the second FeFET and connected to the second bit line in each bit cell to fall within a first voltage range, so that the first FeFET and/or the second FeFET is always cut off. When a voltage of the gate of the FeFET falls within the first voltage range, the FeFET is cut off.

Correspondingly, the following manner may be used to implement the case in which a match value is input by using a first bit line and a reverse value of the match value is input by using a second bit line, or a match value is input by using the second bit line and a reverse value of the match value is input by using the first bit line: setting a voltage of a gate that is of the first FeFET and connected to the first bit line as a first voltage, and setting a voltage of a gate that is of the second FeFET and connected to the second bit line as a second voltage, to input a match value by using the first bit line and input a reverse value of the match value by using the second bit line, or input a match value by using the second bit line and input a reverse value of the match value by using the first bit line.

In an embodiment, for both the CAM shown in the structure 1 and the CAM shown in the structure 2, if the FeFET includes a gate and a back gate, a first FeFET and/or a second FeFET in each bit cell may be set, in the following manner, to be always cut off: setting a voltage difference between a gate that is of the first FeFET and connected to the first bit line and a back gate of the first FeFET in each bit cell to fall within a first voltage range, and/or setting a voltage difference between a gate that is of the second FeFET and connected to the second bit line and a back gate of the second FeFET in each bit cell to fall within the first voltage range, so that the first FeFET and/or the second FeFET is always cut off. When a voltage difference between the gate and the back gate of the FeFET falls within the first voltage range, the FeFET is cut off.

Correspondingly, the following manner may be used to implement the case in which a match value is input by using a first bit line and a reverse value of the match value is input by using a second bit line, or a match value is input by using the second bit line and a reverse value of the match value is input by using the first bit line: setting a voltage difference between a gate that is of the first FeFET and connected to the first bit line and a back gate of the first FeFET as a first voltage, and setting a voltage difference between a gate that is of the second FeFET and connected to the second bit line and a back gate of the second FeFET as a second voltage, to input a match value by using the first bit line and input a reverse value of the match value by using the second bit line, or input a match value by using the second bit line and input a reverse value of the match value by using the first bit line.

For example, if a match value is input by using the first bit line, when the match value is 0, the first voltage falls within a second voltage range, and the second voltage falls within a third voltage range; or when the match value is 1, the first voltage falls within a third voltage range, and the second voltage falls within a second voltage range. If a match value is input by using the second bit line, when the match value is 0, the first voltage falls within a third voltage range, and the second voltage falls within a second voltage range; or when the match value is 1, the first voltage falls within a second voltage range, and the second voltage falls within a third voltage range.

If a FeFET includes a gate but does not include a back gate, when a voltage of the gate falls within the second voltage range, a match value is input into the FeFET for matching; or when a voltage of the gate falls within the third voltage range, the FeFET is always conducted. Alternatively, if a FeFET includes a gate and a back gate, when a voltage difference between the gate and the back gate falls within the second voltage range, a match value is input into the FeFET for matching; or when a voltage difference between the gate and the back gate falls within the third voltage range, the FeFET is always conducted.

In an embodiment, if at least two match entries exist, a match entry with a smallest storage address is output as a match result.

Alternatively, for the CAM shown in the structure 1, when one entry includes data stored in bit cells of one column in the CAM, if at least two match entries exist, an entry including data stored in bit cells of a target column with a smallest column number is output as a match result.

Alternatively, for the CAM shown in the structure 2, when one entry includes data stored in bit cells of one row in the CAM, if at least two match entries exist, an entry including data stored in bit cells of a target row with a smallest row number is output as a match result.

An embodiment of this application provides a method for implementing data matching by using the CAM provided in any one of the first aspect and embodiments of the first aspect. Each bit cell in the CAM includes only two FeFET transistors. In this method, a match value is input by using a bit line connected to a gate, and a match result is output by using a match line connected to a drain. Compared with a matching method in the prior art, the method can reduce matching power consumption because the CAM includes only two FeFET transistors, and a size of the CAM is relatively small.

According to a fourth aspect, an embodiment of this application provides a network device, including a processor, a communications interface, a first memory, a second memory, and a communications bus. The processor, the communications interface, the first memory, and the second memory communicate with each other through the communications bus. The first memory stores computer executable program code, and the second memory is the CAM provided in any one of the first aspect and embodiments of the first aspect. The processor is configured to execute the computer executable program code stored in the first memory to control the second memory to perform the data processing method described in any one of the second aspect and embodiments of the second aspect. Alternatively, the processor is configured to execute the computer executable program code stored in the first memory to control the second memory to perform the data processing method provided in any one of the third aspect and embodiments of the third aspect.

DESCRIPTION OF EMBODIMENTS

In some dielectric crystals, because of a structure of a unit cell, a center of positive charges does not coincide with a center of negative charges, there is an electric dipole moment, and electric polarization intensity that is not equal to 0 is generated, so that the crystal is spontaneously polarized. In addition, an electric dipole moment direction may vary with an external electric field, presenting a characteristic similar to that of a ferromagnet. Such an attribute of the crystal is referred to as ferroelectricity.

A ferro-electric field effect transistor (FeFET) is a field effect transistor with a ferroelectric characteristic. A main principle of the ferro-electric field effect transistor is that a material with a ferroelectric characteristic is added to a gate insulator of the field effect transistor, so that the FeFET has a hysteresis curve characteristic, and a threshold voltage of the FeFET has two stable states. Therefore, the binary state may be stored in the FeFET. If a gate voltage of the FeFET is greater than the threshold voltage, the FeFET is conducted; or if a gate voltage of the FeFET is less than the threshold voltage, the FeFET is cut off. In addition, data is still stored even if the gate voltage of the FeFET is 0.

A CAM is a memory performing addressing based on content, and is a special storage array. A working mechanism of the CAM is comparing one input data item with all data items stored in the CAM to determine whether the input data item matches the data items stored in the CAM, and outputting match information corresponding to the data item. The CAM is an important component of a network device such as a switching device or a router. A typical CAM is a TCAM, and the TCAM is developed from the CAM. Each bit bit in a common CAM memory has only two states: "0" and "1", and each bit bit in the TCAM has three states, has a "don't care" state in addition to "0" and "1". Therefore, "ternary" exists. The TCAM is implemented by using a mask. Because of the third state of the TCAM, the TCAM can perform search through exact match and can also perform search through fuzzy match.

Figure 1:
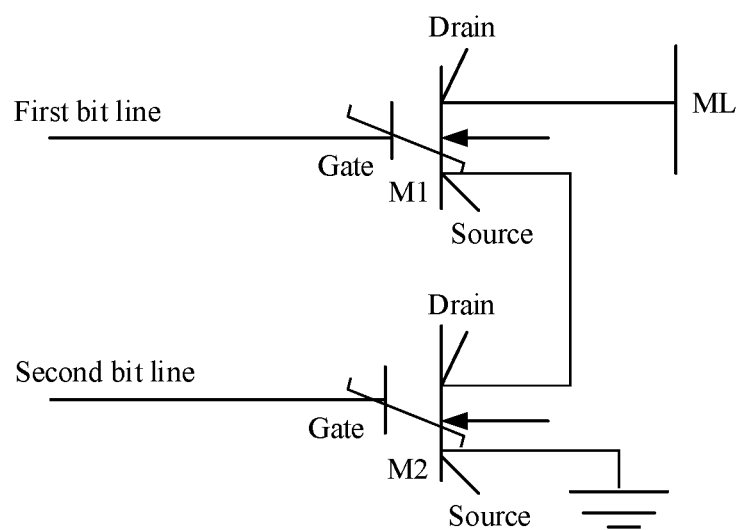
FIG. 1 is a schematic structural diagram of a FeFET according to an embodiment of this application.

An embodiment of this application provides a content addressable memory, and each bit cell in the content addressable memory includes two FeFETs connected in series. For example, as shown in FIG. 1, a drain of a first FeFET (M1 shown in FIG. 1) is connected to an ML, a source of the first FeFET is connected to a drain of a second FeFET (M2 shown in FIG. 1), and a source of the second FeFET is grounded. A gate of the first FeFET is connected to a first bit line, and a gate of the second FeFET is connected to a second bit line.

In an embodiment, the FeFET further includes a back gate. Correspondingly, a back gate of the first FeFET is connected to a first back gate line, and a back gate of the second FeFET is connected to a second back gate line.

Each bit cell is an XNOR gate based on the two FeFETs connected in series. A bit line is used to input a match key during a search operation. Each bit cell can implement an XNOR logical operation (or described as a comparison operation) on data stored in the bit cell and a match value.

For example, M1 in a bit cell stores a to-be-matched value, and M2 stores a reverse value of the to-be-matched value. Table 1 is an embodiment of a truth table of the bit cell.

TABLE 1

| M1 | M2 | Key value | Status of M1 | Status of M2 | Output value of an ML | Match result between a key and M1 |
| --- | --- | --- | --- | --- | --- | --- |
| 0 | 1 | 0 | Cut off | Conducted | 1 | Match |
| 0 | 1 | 1 | Conducted | Conducted | 0 | Mismatch |
| 1 | 0 | 0 | Conducted | Conducted | 0 | Mismatch |
| 1 | 0 | 1 | Conducted | Cut off | 1 | Match |
| 0 | 0 |   | At least one of M1 and M2 is cut off |   | 1 | Mask match |

With reference to Table 1, the first four rows are exact match. Only when a value of M1 is different from a key value, both M1 and M2 are conducted, and a match result between the key value and M1 is "mismatch". In other cases, when a value stored in M1 is the same as a key value, at least one of M1 and M2 is cut off, and a match result between the key value and M1 is "match". The fifth row is mask match. An example in which a mask of the bit cell is 0 is used in Table 1. That the mask is 0 indicates that the bit does not participate in matching, and both M1 and M2 store 0. At least one of M1 and M2 is cut off regardless of an input key value. In this case, a value stored in M1 is the same as the key value, and a match result between the key value and M1 is "match".

During writing data into bit cells of one row or bit cells of one column in the content addressable memory, a bit line is used to input to-be-written data. For example, when an entry matching manner is exact match or mask match and a mask of a bit cell is 1, during writing data into the bit cell, different values are written into a first FeFET or a second FeFET by using a first bit line and a second bit line. To-be-written data is written into the first FeFET and a reverse value of the to-be-written data is written into the second FeFET, or to-be-written data is written into the second FeFET and a reverse value of the to-be-written data is written into the first FeFET. When an entry matching manner is mask match and a mask of a bit cell is 0, during writing data into the bit cell, 0 is written into both a first FeFET and a second FeFET by using a first bit line and a second bit line.

Based on the bit cell shown in FIG. 1, an embodiment of this application provides a CAM. The CAM includes bit cells of M rows and N columns, and both M and N are positive integers greater than or equal to 1.

For a structure of each bit cell, refer to the bit cell shown in FIG. 1. For example, each bit cell includes a first FeFET and a second FeFET, a source of the first FeFET is connected to a drain of the second FeFET, and a source of the second FeFET is grounded.

In an embodiment, one entry includes data stored in bit cells of one column in the CAM. In an embodiment, bit cells of a same column correspond to a same match line, and a drain of a first FeFET in each bit cell of a same column is connected to a match line corresponding to the column. Bit cells of a same row correspond to a same first bit line and a same second bit line, a gate of a first FeFET in each bit cell of a same row is connected to a first bit line corresponding to the row, and a gate of a second FeFET in each bit cell of a same row is connected to a second bit line corresponding to the row. In an embodiment, bit cells of a same column separately correspond to a same first back gate line and a same second back gate line, a back gate of a first FeFET in each bit cell of a same column is connected to a first back gate line corresponding to the column, and a back gate of a second FeFET in each bit cell of a same column is connected to a second back gate line corresponding to the column.

Figure 2:
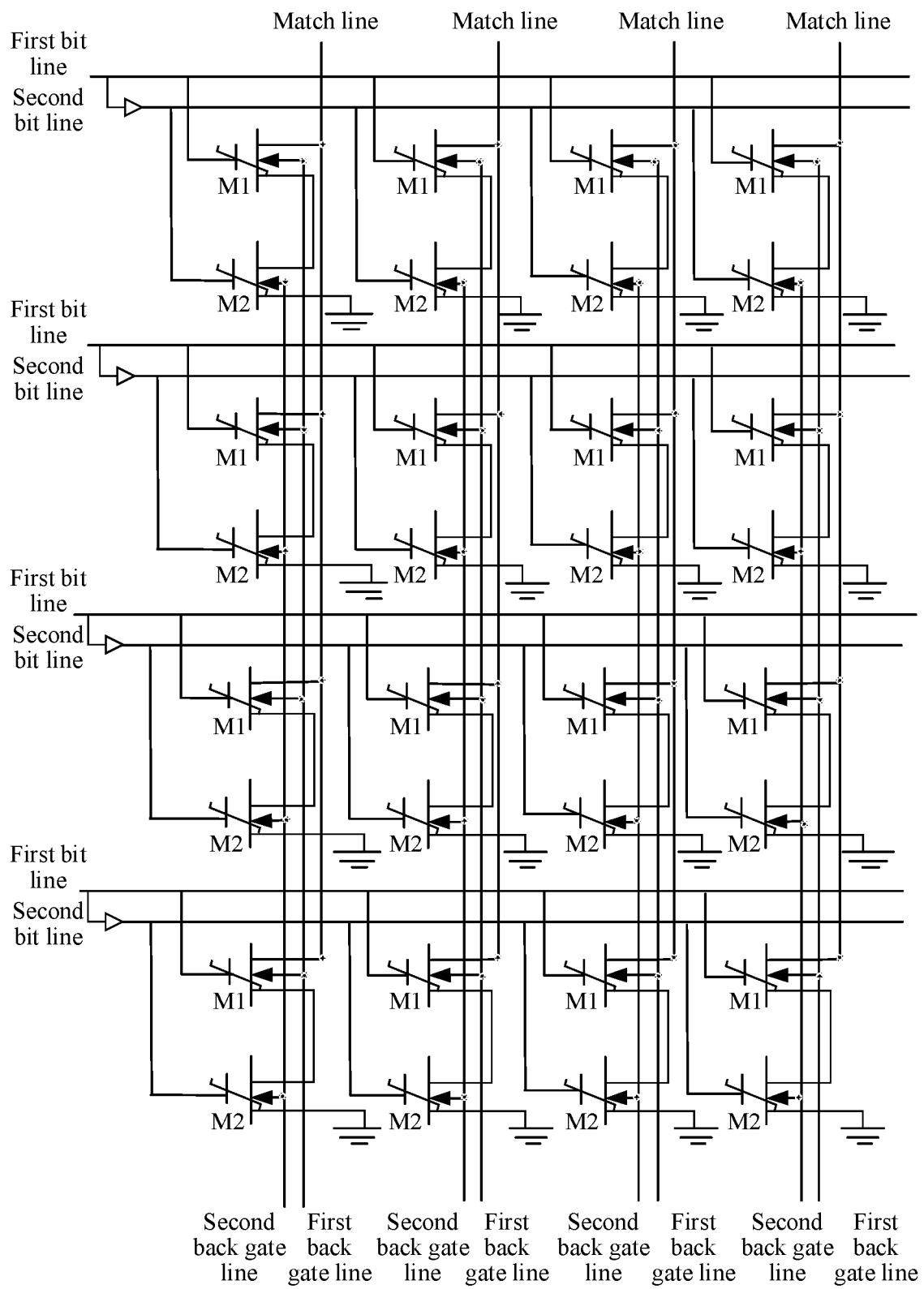
FIG. 2 is a schematic structural diagram of a CAM according to an embodiment of this application.

For example, FIG. 2 shows an embodiment of a CAM. The CAM includes bit cells of four rows and four columns. One entry includes data stored in bit cells of one column, and each bit cell includes two FeFETs: M1 and M2. A drain of M1 in each bit cell of a same column is connected to a match line corresponding to the column. Gates of all M1 in bit cells of a same row are connected to a first bit line corresponding to the row, and gates of all M2 in bit cells of a same row is connected to a second bit line corresponding to the row. In addition, a back gate of M1 in each bit cell of a same column is connected to a first back gate line corresponding to the column, and a back gate of M2 in each bit cell of a same column is connected to a second back gate line corresponding to the column.

In an embodiment, one entry includes data stored in bit cells of one column in the CAM. In an embodiment, one entry includes data stored in bit cells of one row in the CAM. In an embodiment, bit cells of a same row correspond to a same match line, a drain of a first FeFET in each bit cell of a same row is connected to a match line corresponding to the row, bit cells of a same column correspond to a same first bit line and a same second bit line, a gate of a first FeFET in each bit cell of a same column is connected to a first bit line corresponding to the column, and a gate of a second FeFET in each bit cell of a same column is connected to a second bit line corresponding to the column.

Likewise, in an embodiment, bit cells of a same row separately correspond to a same first back gate line and a same second back gate line, a back gate of a first FeFET in each bit cell of a same row is connected to a first back gate line corresponding to the row, and a back gate of a second FeFET in each bit cell of a same row is connected to a second back gate line corresponding to the row.

In the CAM provided in an embodiment of the application, each bit cell includes only two FeFET transistors. In the prior art, each bit cell includes 16 transistors. By comparison, an area of the CAM provided in an embodiment of the application is greatly reduced, thereby reducing power consumption of the CAM.

An embodiment of this application further provides a data processing method that is based on the foregoing CAM provided in the embodiments of this application. The data processing method including: writing data into the CAM and searching the CAM for data (or described as performing matching with data in the CAM). Generally, the CAM is used to store entry data in a table such as a routing table or an ACL table. One routing table or ACL table includes a plurality of entries. Therefore, the writing data into the CAM described in an embodiment of the application is writing data of each entry of a routing table or an ACL table into the CAM. Correspondingly, the performing matching with data in the CAM is searching the CAM for data in an entry of a routing table or an ACL table.

Before the data processing method provided in an embodiment of the application is described in detail, several terms related to the data processing method provided in an embodiment of the application are described first.

Voltages involved in matching are a first voltage range, a second voltage range, and a third voltage range. If a voltage input from a gate of a FeFET falls within the first voltage range, the FeFET is always cut off. If a voltage input from a gate of a FeFET falls within the second voltage range, the FeFET is conducted during writing 1 into the FeFET, or the FeFET is cut off during writing 0 into the FeFET. If a voltage input from a gate of a FeFET falls within the third voltage range, the FeFET is always conducted. For example, the first voltage range is from −2 V to −0.6 V, the second voltage range is between voltages approximately at 0 V, for example, from −0.5 V to 0.5 V, and the third voltage range is from 0.6 V to 1.6 V.

Voltages involved in writing are a voltage range for writing 0 and a voltage range for writing 1. The voltage range for writing 0 and the voltage range for writing 1 are different voltage ranges. During writing 0 into a FeFET, a gate voltage of the FeFET is set to fall within the voltage range for writing 0. During writing 1 into a FeFET, a gate voltage of the FeFET is set to fall within the voltage range for writing 1. In addition, values of the voltage range for writing 0 and the voltage range for writing 1 depend on an attribute of a FeFET component. Generally, a voltage for writing 0 and a voltage for writing 1 have opposite polarities, but a size relationship between absolute values of the voltage for writing 0 and the voltage for writing 1 is not limited. For example, the voltage range for writing 0 is usually a range that is less than a negative voltage and whose lower limit is not limited, and the voltage range for writing 1 is usually a range that is greater than a positive voltage and whose upper limit is not limited. For example, the voltage range for writing 0 is from −3 V to −2 V, and the voltage range for writing 1 is from 2 V to 3 V.

The following separately describes the two data processing methods.

Figure 3:
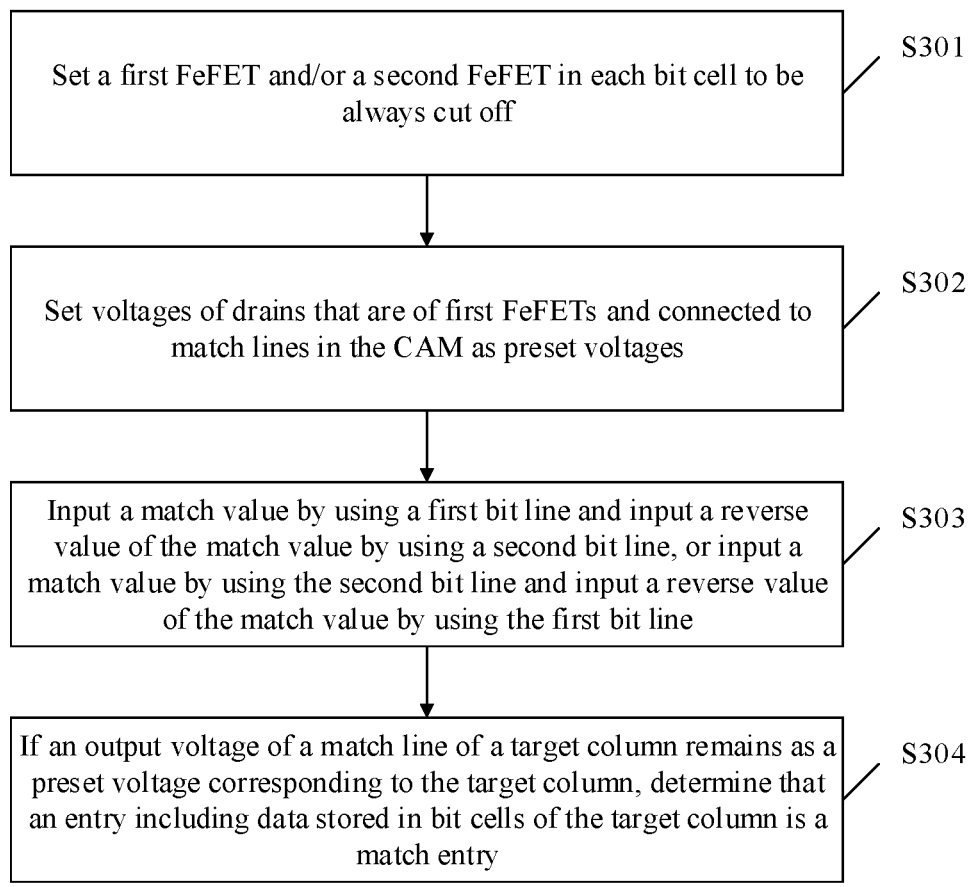
FIG. 3 is a schematic flowchart of a method for searching a CAM for data according to an embodiment of this application.

1. Search a CAM for data:

Referring to FIG. 3, if one entry includes data stored in bit cells of one column in a CAM, the searching a CAM for data may be implemented in the following operations S301 to S304.

S301. Set a first FeFET and/or a second FeFET in each bit cell to be always cut off.

In an embodiment, each FeFET includes a gate but does not include a back gate. In an embodiment of this operation, a voltage of a gate that is of the first FeFET and connected to the first bit line and/or a voltage of a gate that is of the second FeFET and connected to the second bit line in each bit cell is set to fall within a first voltage range. When a gate voltage of a FeFET falls within the first voltage range, the FeFET is cut off.

In an embodiment, each FeFET includes a gate and a back gate. In an embodiment of this operation, a voltage difference between a gate that is of the first FeFET and connected to the first bit line and a back gate of the first FeFET in each bit cell and a voltage difference between a gate that is of the second FeFET and connected to the second bit line and a back gate of the second FeFET in each bit cell is set to fall within a first voltage range. When a voltage difference between a gate and a back gate of a FeFET falls within the first voltage range, the FeFET is cut off.

S302. Set voltages of drains that are of first FeFETs and connected to match lines in the CAM as preset voltages.

Preset voltages corresponding to different match lines may be the same or different.

In an embodiment, the preset voltage is any voltage. In an embodiment, the match line is pre-charged to the preset voltage.

S303. Input a match value by using a first bit line and input a reverse value of the match value by using a second bit line, or input a match value by using the second bit line and input a reverse value of the match value by using the first bit line.

In an embodiment, each FeFET includes a gate but does not include a back gate. In an embodiment of this operation, a voltage of a gate that is of a first FeFET and connected to a first bit line is set as a first voltage, and a voltage of a gate that is of a second FeFET and connected to a second bit line is set as a second voltage, so that a match value is input by using the first bit line and a reverse value of the match value is input by using the second bit line, or a match value is input by using the second bit line and a reverse value of the match value is input by using the first bit line.

It should be noted that voltages of gates connected to different first bit lines may be the same or different, that is, first voltages corresponding to different first bit lines may be the same or different, and voltages of gates connected to different second bit lines may be the same or different, that is, second voltages corresponding to different second bit lines may be the same or different.

In an embodiment, each FeFET includes a gate and a back gate. In an embodiment of this operation, a voltage difference between a gate that is of a first FeFET and connected to a first bit line and a back gate of the first FeFET is set as a first voltage, and a voltage difference between a gate that is of a second FeFET and connected to a second bit line and a back gate of the second bit line is set as a second voltage, so that a match value is input by using the first bit line and a reverse value of the match value is input by using the second bit line, or a match value is input by using the second bit line and a reverse value of the match value is input by using the first bit line.

It should be noted that voltage differences between gates that are of first FeFETs and connected to different first bit lines and back gates of the first FeFETs may be the same or different, that is, first voltages corresponding to different first bit lines may be the same or different, and voltage differences between gates that are of second FeFETs and connected to different second bit lines and back gates of the second FeFETs may be the same or different, that is, second voltages corresponding to different second bit lines may be the same or different.

For example, if a match value is input by using the first bit line, when the match value is 0, the first voltage falls within a second voltage range, and the second voltage falls within a third voltage range; or when the match value is 1, the first voltage falls within a third voltage range, and the second voltage falls within a second voltage range. If a match value is input by using the second bit line, when the match value is 0, the first voltage falls within a third voltage range, and the second voltage falls within a second voltage range; or when the match value is 1, the first voltage falls within a second voltage range, and the second voltage falls within a third voltage range.

If a FeFET includes a gate but does not include a back gate, when a voltage of the gate falls within the second voltage range, a match value is input into the FeFET for matching, or when a voltage of the gate falls within the third voltage range, the FeFET is always conducted; or if a FeFET includes a gate and a back gate, when a voltage difference between the gate and the back gate falls within the second voltage range, a match value is input into the FeFET for matching, or when a voltage difference between the gate and the back gate falls within the third voltage range, the FeFET is always conducted.

It should be noted that a sequence of performing S301 to S303 is not limited in an embodiment of the application.

S304. If an output voltage of a match line of a target column remains as a preset voltage corresponding to the target column, determine that an entry including data stored in bit cells of the target column is a match entry.

In this operation, if an output voltage of a match line of a column remains as the preset voltage in S302, it is determined that an entry including data stored in bit cells of the column is a match entry. If an output voltage of a match line of a column leaks to 0, it indicates that there is at least one bit cell that does not match in all bit cells of the column.

In an actual application, output voltages of match lines of a plurality of columns may remain as preset voltages, in other words, at least two match entries exist. In this scenario, if at least two match entries exist, a match entry with a smallest storage address is output as a match result. Alternatively, if at least two match entries exist, an entry including data stored in bit cells of a target column with a smallest column number is output as a match result.

For example, with reference to the CAM with four rows and four columns shown in FIG. 2, a possible match result is shown in Table 2.

TABLE 2

| | Match value (key) | Entry of the first column (entry 1) | Entry of the second column (entry 2) | Entry of the third column (entry 3) | Entry of the fourth column (entry 4) |
|---|---|---|---|---|---|
| Bit cells 1 of the first row | 0 | 0 | 0 | 1 (A mask is 0) | 0 |
| Bit cells 2 of the second row | 1 | 0 | 1 | 1 | 0 |
| Bit cells 3 of the third row | 1 | 1 | 1 | 1 | 1 |
| Bit cells 4 of the fourth row | 0 | 1 | 0 | 0 | 1 (A mask is 0) |
| Entry match result | | Mismatch | Match | Match | Mismatch |

As shown in Table 2, both the entry of the second column and the entry of the third column are match entries, and in this case, the entry of the second column is selected as a match entry.

Figure 4:
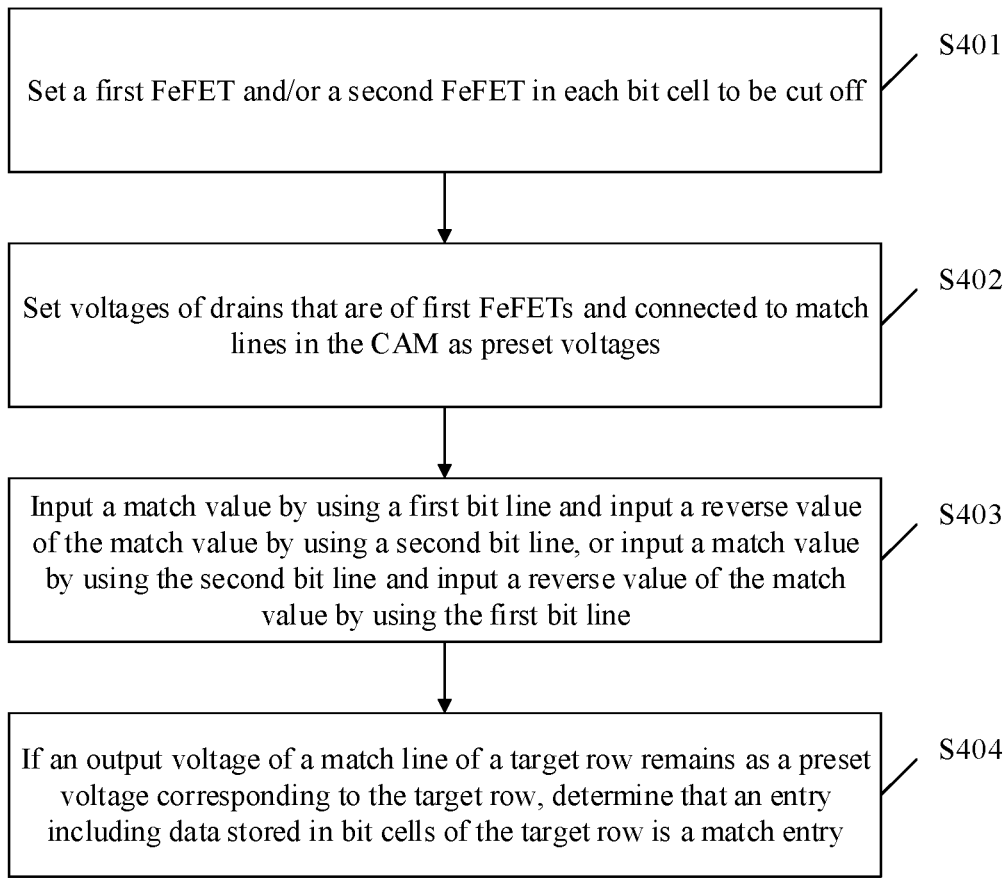
FIG. 4 is a schematic flowchart of another method for searching a CAM for data according to an embodiment of this application.

Likewise, referring to FIG. 4, if one entry includes data stored in bit cells of one row in a CAM, the searching a CAM for data may be implemented in the following operations S401 to S404.

S401. Set a first FeFET and/or a second FeFET in each bit cell to be cut off.

S402. Set voltages of drains that are of first FeFETs and connected to match lines in the CAM as preset voltages.

Preset voltages corresponding to different match lines are the same or different.

S403. Input a match value by using a first bit line and input a reverse value of the match value by using the second bit line, or input a match value by using the second bit line and input a reverse value of the match value by using the first bit line.

It should be noted that a sequence of performing S401 to S403 is not limited in an embodiment of the application.

S404. If an output voltage of a match line of a target row remains as a preset voltage corresponding to the target row, determine that an entry including data stored in bit cells of the target row is a match entry.

In an embodiment, if at least two match entries exist, a match entry with a smallest storage address is output as a match result.

Alternatively, if at least two match entries exist, an entry including data stored in bit cells of a target row with a smallest row number is output as a match result.

It should be noted that for an embodiment of the data processing method described in operations S401 to S404, reference may be made to the data processing method described in operations S301 to S304. A difference lies in that the data processing method described in S301 to S304 is applied to a scenario in which one entry includes data stored in bit cells of one column in the CAM, and the data processing method described in S401 to S404 is applied to a scenario in which one entry includes data stored in bit cells of one row in the CAM.

In the method for implementing data matching in the CAM provided in the embodiments of this application, each bit cell in the CAM includes only two FeFET transistors. In this method, a match value is input by using a bit line connected to a gate, and a match result is output by using a match line connected to a drain. Compared with a matching method in the prior art, the method can reduce matching power consumption because the CAM includes only two FeFET transistors, and a size of the CAM is relatively small.

2. Write Data into a CAM:

In an actual application, one data table includes a plurality of entries, an entry matching manner is stored in a configuration file of the data table. All entries in a same data table have a same matching manner. Therefore, when table search is performed in the CAM, a matching manner of the entry may be determined based on a configuration file of the table. Entry matching manners include exact match and mask match. The exact match means that when an input match value is the same as a value stored in a bit cell, it indicates that the value stored in the bit cell matches the to-be-matched value. Otherwise, it is considered that the two values do not match. The mask match means determining, based on a mask value of a bit cell, whether a value stored in the bit cell participates in matching. For example, if an entry matching manner is mask match and a mask of a bit cell is 1, it indicates that a value stored in the bit cell participates in matching, and when the value stored in the bit cell is the same as a to-be-matched value, it indicates that the two values match. If an entry matching manner is mask match and a mask of a bit cell is 0, it indicates that a value stored in the bit cell does not participate in matching.

Figure 5:
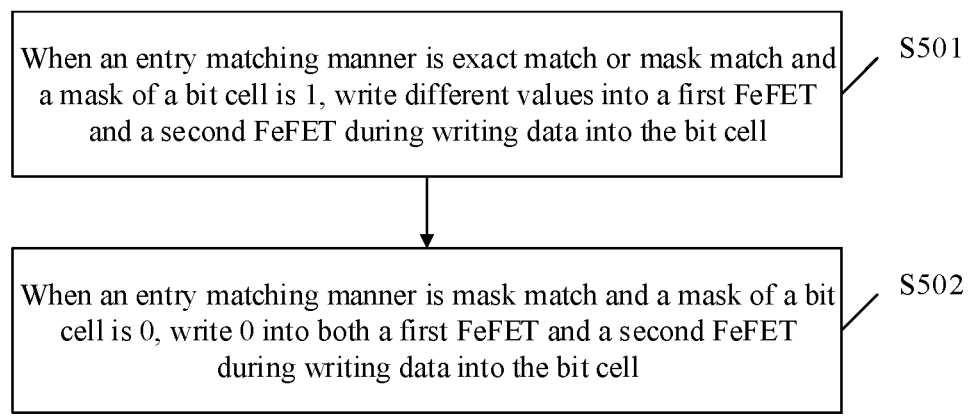
FIG. 5 is a schematic flowchart of a method for writing data into a CAM according to an embodiment of this application.

Referring to FIG. 5, the process of writing data into a CAM includes the following operations S501 and S502.

S501. When an entry matching manner is exact match or mask match and a mask of a bit cell is 1, write different values into a first FeFET and a second FeFET during writing data into the bit cell.

In an embodiment, the FeFET includes a gate and a back gate. Correspondingly, in an embodiment of this operation, a voltage difference between a gate that is of the first FeFET and connected to the first bit line and a back gate of the first FeFET is set to fall within a fourth voltage range, and a voltage difference between a gate that is of the second FeFET and connected to the second bit line and a back gate of the second FeFET is set to fall within a fifth voltage range, so that different values are written into the first FeFET and the second FeFET. The fourth voltage range and the fifth voltage range are different.

In an embodiment, the FeFET includes a gate but does not include a back gate. Correspondingly, in an embodiment of this operation, a voltage of a gate that is of the first FeFET and connected to the first bit line is set to fall within a fourth voltage range, and a voltage of a gate that is of the second FeFET and connected to the second bit line is set to fall within a fifth voltage range, so that different values are written into the first FeFET and the second FeFET. The fourth voltage range and the fifth voltage range are different.

It should be noted that, in an actual application, for a FeFET including a back gate, the back gate is usually grounded, and therefore, a voltage difference between a gate and the back gate is a voltage of the gate.

For example, when an entry matching manner is exact match or mask match and a mask of a bit cell is 1, during writing 1 into the bit cell, the fourth voltage range is a voltage range for writing 1, in other words, the voltage range is used to write 1 into the first FeFET, and the fifth voltage range is a voltage range for writing 0, in other words, the voltage range is used to write 0 into the second FeFET. Alternatively, the fourth voltage range is a voltage range for writing 0, in other words, the voltage range is used to write 0 into the first FeFET, and the fifth voltage range is a voltage range for writing 0, in other words, the voltage range is used to write 1 into the second FeFET.

In all of the foregoing embodiments, 1 is written into one FeFET in a bit cell, 0 is written into the other FeFET, one of the two FeFETs in the bit cell is a dominant FeFET, and a value stored in the bit cell depends on a value stored in the dominant FeFET.

S502. When an entry matching manner is mask match and a mask of a bit cell is 0, write 0 into both a first FeFET and a second FeFET during writing data into the bit cell.

In an embodiment, the FeFET includes a gate and a back gate. Correspondingly, in an embodiment of this operation, a voltage difference between a gate that is of the first FeFET and connected to the first bit line and a back gate of the first FeFET and a voltage difference between a gate that is of the second FeFET and connected to the second bit line and a back gate of the second FeFET are set to fall within a same voltage range, so that values written into the first FeFET and the second FeFET are 0.

In an embodiment, the FeFET includes only a gate but does not include a back gate. Correspondingly, in an embodiment of this operation, a voltage of a gate that is of the first FeFET and connected to the first bit line and a gate that is of the second FeFET and connected to the second bit line are set to fall within a same voltage range, so that values written into the first FeFET and the second FeFET are 0.

The same voltage range is a voltage range for writing 0.

Figure 6:
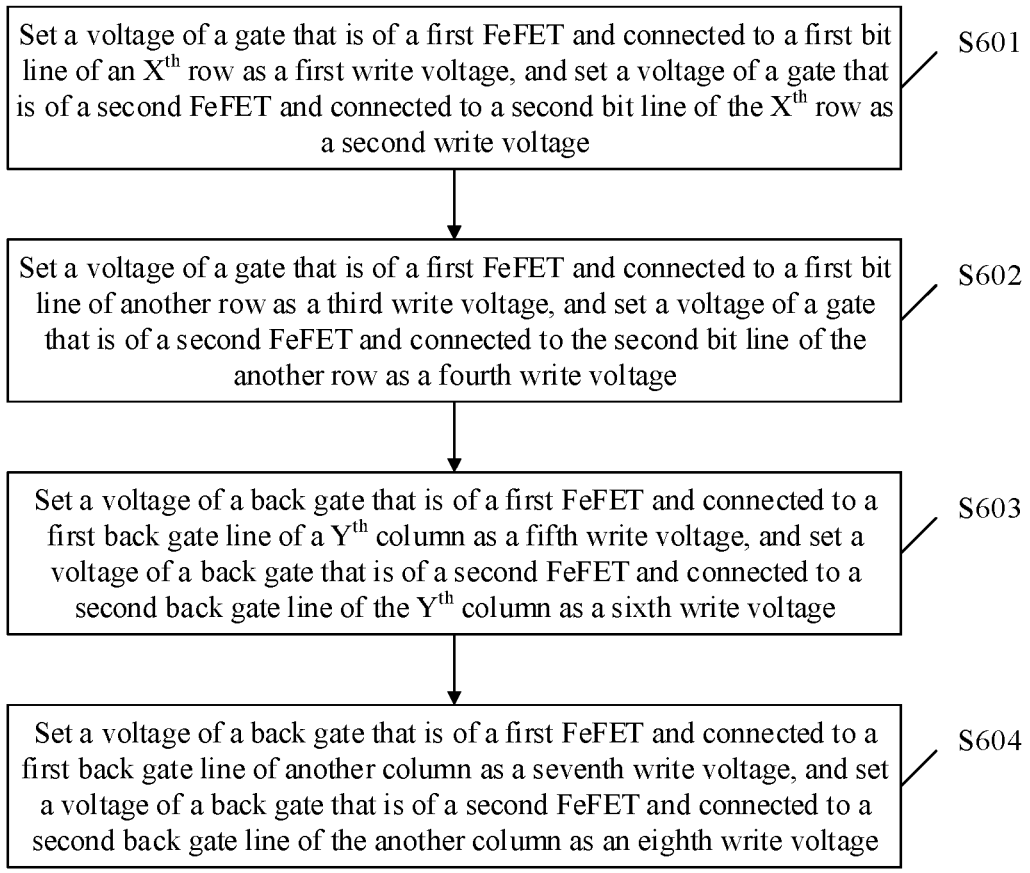
FIG. 6 is a schematic flowchart of a method for writing data into a bit cell in a CAM according to an embodiment of this application.

In an embodiment of the method shown in FIG. 5, if a FeFET includes a gate and a back gate, when one entry includes data stored in bit cells of one column in the CAM, during writing data into a bit cell of the $X^{th}$ row and the $Y^{th}$ column, a write voltage difference between a gate and a back gate of a FeFET included in the bit cell of the $X^{th}$ row and the $Y^{th}$ column needs to be set to fall within a range, for example, the fourth voltage range or the fifth voltage range described above, and write voltage differences between gates and back gates of FeFETs in bit cells of other rows and other columns need to be set to fall within another range (which is described as a sixth voltage range in an embodiment of the application), so that data is written only into the bit cell of the $X^{th}$ row and the $Y^{th}$ column. As shown in FIG. 6, the following process is performed.

S601. Set a voltage of a gate that is of a first FeFET and connected to the first bit line of the $X^{th}$ row as a first write voltage, and set a voltage of a gate that is of a second FeFET and connected to the second bit line of the $X^{th}$ row as a second write voltage.

S602. Set a voltage of a gate that is of a first FeFET and connected to the first bit line of another row as a third write voltage, and set a voltage of a gate that is of a second FeFET and connected to the second bit line of the another rows as a fourth write voltage.

It should be noted that voltages of gates that are of first FeFETs and connected to first bit lines of different rows may be the same or different, in other words, third write voltages corresponding to different rows may be the same or different. Likewise, voltages of gates that are of second FeFETs and connected to second bit lines of different rows may be the same or different, in other words, fourth write voltages corresponding to different rows may be the same or different.

S603. Set a voltage of a back gate that is of a first FeFET and connected to a first back gate line of the $Y^{th}$ column as a fifth write voltage, and set a voltage of a back gate that is of a second FeFET and connected to a second back gate line of the $Y^{th}$ column as a sixth write voltage.

For example, the fifth write voltage falls within a voltage range between voltages approximately at 0 V, and the sixth write voltage falls within a voltage range between voltages approximately at 0 V. The two voltage ranges may be the same or different. For example, the fifth write voltage falls within a voltage range of −0.5 V to 0.5 V, and the fifth write voltage falls within a voltage range of −0.4 V to 0.4 V.

S604. Set a voltage of a back gate that is of a first FeFET and connected to a first back gate line of another column as a seventh write voltage, and set a voltage of a back gate that is of a second FeFET and connected to a second back gate line of the another column as an eighth write voltage.

It should be noted that voltages of back gates that are of first FeFETs and connected to first back gate lines of different columns may be the same or different, in other words, seventh write voltages corresponding to different columns may be the same or different. Likewise, voltages of back gates that are of second FeFETs and connected to second back gate lines of different columns may be the same or different, in other words, eighth write voltages corresponding to different columns may be the same or different.

In an embodiment, a difference between the first write voltage and the fifth write voltage falls within the fourth voltage range, and a difference between the second write voltage and the sixth write voltage falls within the fifth voltage range, so that data is written only into the bit cell of the $X^{th}$ row and the $Y^{th}$ column; and a difference between the third write voltage and the fifth write voltage, a difference between the fourth write voltage and the sixth write voltage, a difference between the third write voltage and the seventh write voltage, a difference between the fourth write voltage and the eighth write voltage, a difference between the first write voltage and the seventh write voltage, and a difference between the second write voltage and the eighth write voltage fall within a sixth voltage range, so that no data is written into another bit cell. The fourth voltage range and the fifth voltage range are different. For example, the fourth voltage range is a voltage range for writing 0, and the fifth voltage range is a voltage range for writing 1. Alternatively, the fourth voltage range is a voltage range for writing 1, and the fifth voltage range is a voltage range for writing 0. The sixth voltage range is a voltage range for writing no data, namely, a voltage range other than the voltage range for writing 0 and the voltage range for writing 1.

For example, during writing 0 into a bit cell of the $X^{th}$ row and the $Y^{th}$ column, the difference between the first write voltage and the fifth write voltage falls within the voltage range for writing 0, so that 0 is written into a first FeFET in the bit cell, and the difference between the second write voltage and the sixth write voltage falls within the voltage range for writing 1, so that 1 is written into a second FeFET in the bit cell. In this way, when the first FeFET is a dominant FeFET, data stored in the bit cell is 0. Likewise, the difference between the first write voltage and the fifth write voltage falls within the voltage range for writing 1, so that 1 is written into a first FeFET in the bit cell, and the difference between the second write voltage and the sixth write voltage falls within the voltage range for writing 0, so that 0 is written into a second FeFET in the bit cell. In this way, when the first FeFET is a dominant FeFET, data stored in the bit cell is 1.

For example, a ratio of the third write voltage to the first write voltage falls within a preset ratio range, for example, is 0.5, and a ratio of the sixth write voltage to the first write voltage is also 0.5. A ratio of the fourth write voltage to the second write voltage falls within a preset ratio range, for example, is 0.5. A ratio of the seventh write voltage to the second write voltage falls within a preset ratio range, for example, is 0.5.

It should be noted that a sequence of performing S601 to S604 is not limited in an embodiment of the application.

For example, with reference to the CAM shown in FIG. 2, during writing 1 into the second row and the third column, voltage setting of FeFETs of all rows and columns is shown in Table 3.

TABLE 3

| | | First row | | Second row | | Third row | | Fourth row | |
|---|---|---|---|---|---|---|---|---|---|
| | | Gate | Back gate | Gate | Back gate | Gate | Back gate | Gate | Back gate |
| First column | Voltage | $V_{write}/2$ | $V_{write}/2$ | $V_{write}$ | $V_{write}/2$ | $V_{write}/2$ | $V_{write}/2$ | $V_{write}/2$ | $V_{write}/2$ |
| | Voltage difference | 0 | | $V_{write}/2$ | | 0 | | 0 | |
| Second column | Voltage | $V_{write}/2$ | $V_{write}/2$ | $V_{write}$ | $V_{write}/2$ | $V_{write}/2$ | $V_{write}/2$ | $V_{write}/2$ | $V_{write}/2$ |
| | Voltage difference | 0 | | $V_{write}/2$ | | 0 | | 0 | |
| Third column | Voltage | $V_{write}/2$ | 0 | $V_{write}$ | 0 | $V_{write}/2$ | 0 | $V_{write}/2$ | 0 |
| | Voltage difference | $V_{write}/2$ | | $V_{write}$ | | $V_{write}/2$ | | $V_{write}/2$ | |
| Fourth column | Voltage | $V_{write}/2$ | $V_{write}/2$ | $V_{write}$ | $V_{write}/2$ | $V_{write}/2$ | $V_{write}/2$ | $V_{write}/2$ | $V_{write}/2$ |
| | Voltage difference | 0 | | $V_{write}/2$ | | 0 | | 0 | |

With reference to Table 3, it can be learned that only a voltage difference between a gate and a back gate of the bit cell of the second row and the third column reaches a write voltage. Therefore, data is written only into the bit cell of the second row and the third column.

It should be noted that Table 3 describes only a relationship between voltages of a gate and a back gate. Voltages of a gate and a back gate of a FeFET in a bit cell meets the relationship. Voltages of gates of two FeFETs in a same bit cell may be the same or different.

Figure 7:
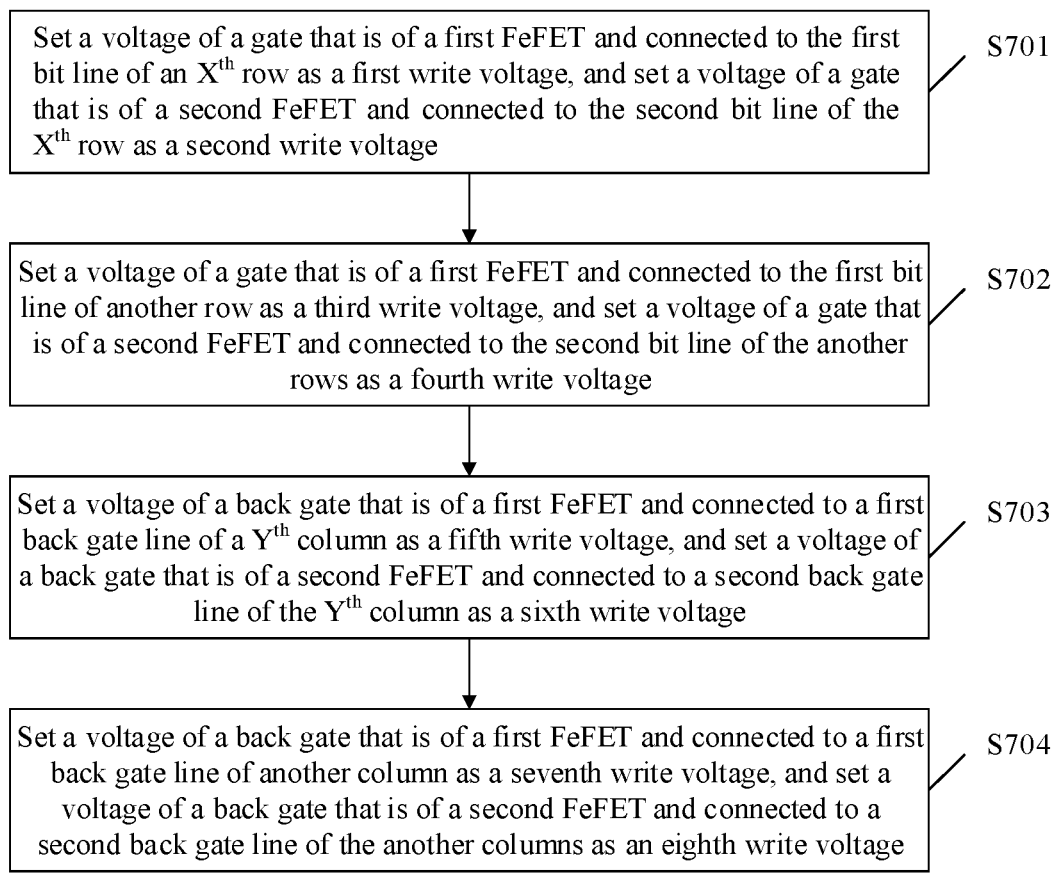
FIG. 7 is a schematic flowchart of another method for writing data into a bit cell in a CAM according to an embodiment of this application.

Likewise, if a FeFET includes a gate and a back gate, when one entry includes data stored in bit cells of one row in the CAM, during writing data into a bit cell of the $X^{th}$ row and the $Y^{th}$ column, as shown in FIG. 7, the following process is performed.

S701. Set a voltage of a gate that is of a first FeFET and connected to the first bit line of the $X^{th}$ row as a first write voltage, and set a voltage of a gate that is of a second FeFET and connected to the second bit line of the $X^{th}$ row as a second write voltage.

S702. Set a voltage of a gate that is of a first FeFET and connected to the first bit line of another row as a third write voltage, and set a voltage of a gate that is of a second FeFET and connected to the second bit line of the another rows as a fourth write voltage.

S703. Set a voltage of a back gate that is of a first FeFET and connected to a first back gate line of the $Y^{th}$ column as a fifth write voltage, and set a voltage of a back gate that is of a second FeFET and connected to a second back gate line of the $Y^{th}$ column as a sixth write voltage.

S704. Set a voltage of a back gate that is of a first FeFET and connected to a first back gate line of another column as a seventh write voltage, and set a voltage of a back gate that is of a second FeFET and connected to a second back gate line of the another columns as an eighth write voltage.

For a process of S701 to S704, refer to S601 to S604, in other words, for setting of the first write voltage, the second write voltage, the third write voltage, the fourth write voltage, the fifth write voltage, the sixth write voltage, the seventh write voltage, and the eighth write voltage, refer to setting of each write voltage in S601 to S604. A difference between a process of S701 to S704 and a process of S601 to S604 is that the process described in S701 to S704 is applied to a scenario in which one entry includes data stored in bit cells of one row in the CAM, and the process described in S601 to S604 is applied to a scenario in which one entry includes data stored in bit cells of one column in the CAM.

It should be noted that a sequence of performing S701 to S704 is not limited in an embodiment of the application.

Figure 8:
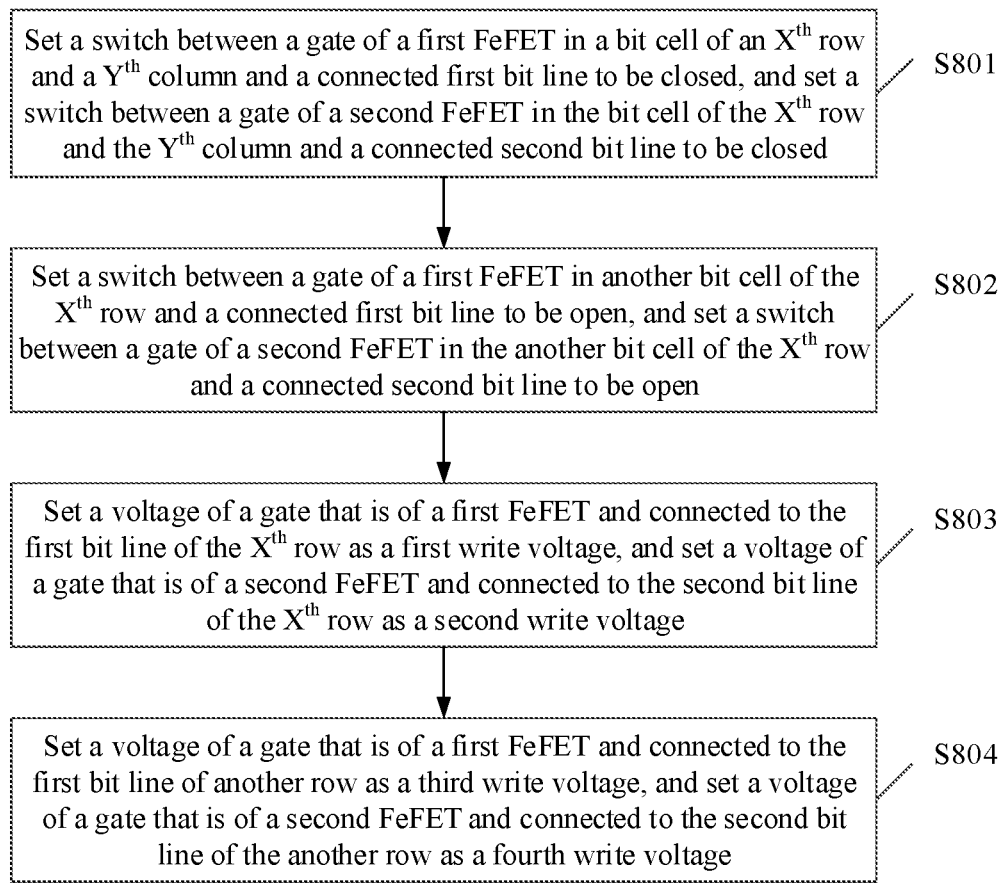
FIG. 8 is a schematic flowchart of still another method for writing data into a bit cell in a CAM according to an embodiment of this application.

The foregoing is described by using an example in which a FeFET includes a gate and a back gate. If a FeFET includes only a gate but does not include a back gate, in a scenario in which one data entry includes data stored in bit cells of one column in the CAM, a switch is disposed between a gate of a first FeFET in each bit cell and a connected first bit line, and a switch is disposed between a gate of a second FeFET in each bit cell and a connected second bit line. Therefore, as shown in FIG. 8, data may be written into a bit cell of the $X^{th}$ row and the $Y^{th}$ column in the following manner:

S801. Set a switch between a gate of a first FeFET in the bit cell of the $X^{th}$ row and the $Y^{th}$ column and a connected first bit line to be closed, and set a switch between a gate of a second FeFET in the bit cell of the $X^{th}$ row and the $Y^{th}$ column and a connected second bit line to be closed.

S802. Set a switch between a gate of a first FeFET in another bit cell of the $X^{th}$ row and a connected first bit line to be open, and set a switch between a gate of a second FeFET in the another bit cell of the $X^{th}$ row and the connected second bit line to be open.

S803. Set a voltage of a gate that is of a first FeFET and connected to the first bit line of the $X^{th}$ row as a first write voltage, and set a voltage of a gate that is of a second FeFET and connected to the second bit line of the $X^{th}$ row as a second write voltage.

S804. Set a voltage of a gate that is of a first FeFET and connected to the first bit line of another row as a third write voltage, and set a voltage of a gate that is of a second FeFET and connected to the second bit line of the another row as a fourth write voltage.

The first write voltage falls within a fourth voltage range, and the second write voltage falls within a fifth voltage range, so that data is written only into the bit cell of the $X^{th}$ row and the $Y^{th}$ column; and the third write voltage and the fourth write voltage fall within a sixth voltage range, so that no data is written into bit cells other than the bit cell of the $X^{th}$ row and the $Y^{th}$ column.

For example, during writing 0 into the bit cell of the $X^{th}$ row and the $Y^{th}$ column, the fourth voltage range is a voltage range for writing 0, so that 0 is written into the first FeFET in the bit cell, and the fifth voltage range is a voltage range for writing 1, so that 1 is written into the second FeFET in the bit cell. In this way, when the first FeFET is a dominant FeFET, data stored in the bit cell is 0. Likewise, during writing 1 into the bit cell of the $X^{th}$ row and the $Y^{th}$ column, the fourth voltage range is a voltage range for writing 1, so that 1 is written into the first FeFET in the bit cell, and the fifth voltage range is a voltage range for writing 0, so that 0 is written into the second FeFET in the bit cell. In this way, when the first FeFET is a dominant FeFET, data stored in the bit cell is 1.

Figure 9:
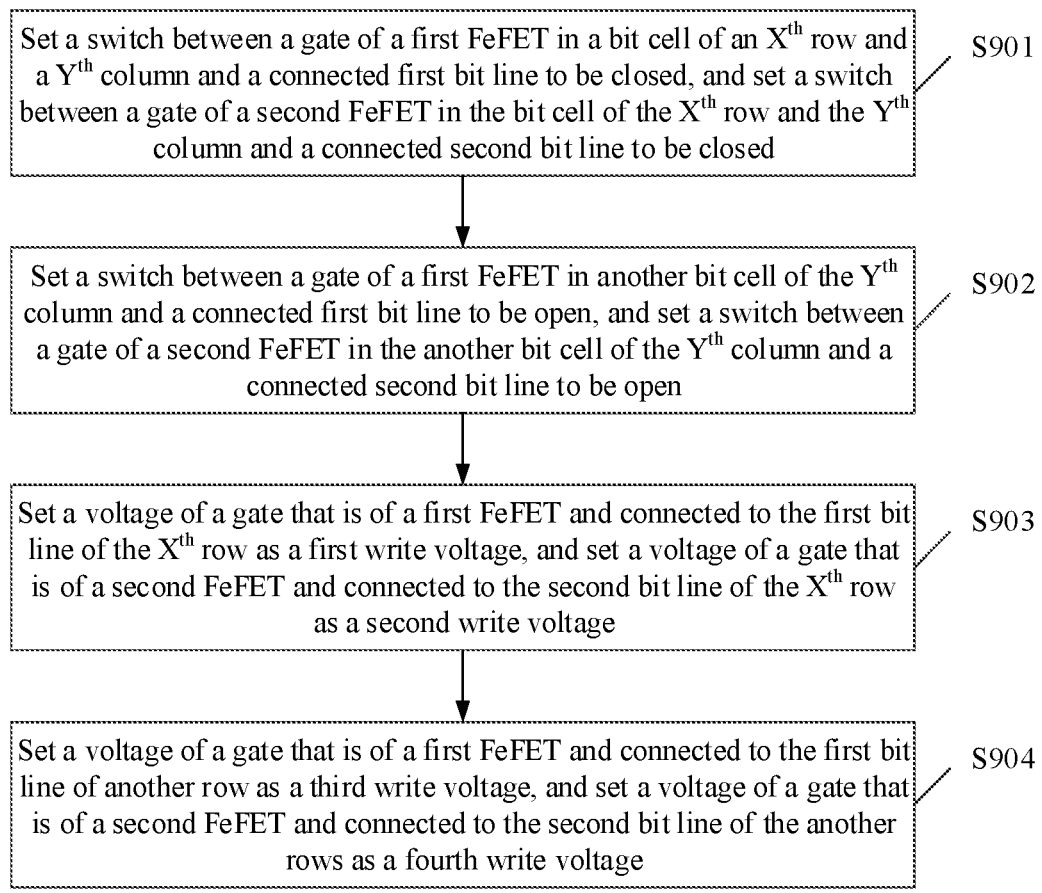
FIG. 9 is a schematic flowchart of yet another method for writing data into a bit cell in a CAM according to an embodiment of this application.

Likewise, if a FeFET includes only a gate but does not include a back gate, in a scenario in which one data entry includes data stored in bit cells of one row in the CAM, a switch may be disposed between a gate of a first FeFET in each bit cell and a connected first bit line, and a switch may be disposed between a gate of a second FeFET in each bit cell and a connected second bit line. Further, as shown in FIG. 9, data may be written into a bit cell of the $X^{th}$ row and the $Y^{th}$ column in the following manner:

S901. Set a switch between a gate of a first FeFET in a bit cell of the $X^{th}$ row and the $Y^{th}$ column and a connected first bit line to be closed, and set a switch between a gate of a second FeFET in the bit cell of the $X^{th}$ row and the $Y^{th}$ column and a connected second bit line to be closed.

S902. Set a switch between a gate of a first FeFET in another bit cell of the $Y^{th}$ column and a connected first bit line to be open, and set a switch between a gate of a second FeFET in the another bit cell of the $Y^{th}$ column and a connected second bit line to be open.

S903. Set a voltage of a gate that is of a first FeFET and connected to the first bit line of the $X^{th}$ row as a first write voltage, and set a voltage of a gate that is of a second FeFET and connected to the second bit line of the $X^{th}$ row as a second write voltage.

S904. Set a voltage of a gate that is of a first FeFET and connected to the first bit line of another row as a third write voltage, and set a voltage of a gate that is of a second FeFET and connected to the second bit line of the another rows as a fourth write voltage.

It should be noted that third write voltage corresponding to first bit lines of different columns may be the same or different, and fourth write voltages corresponding to second bit lines of different columns may be the same or different.

The first write voltage falls within a fourth voltage range, and the second write voltage falls within a fifth voltage range, so that data is written only into the bit cell of the $X^{th}$ row and the $Y^{th}$ column; and the third write voltage and the fourth write voltage fall within a sixth voltage range, so that no data is written into bit cells other than the bit cell of the $X^{th}$ row and the $Y^{th}$ column.

For example, during writing 0 into the bit cell of the $X^{th}$ row and the $Y^{th}$ column, the fourth voltage range is a voltage range for writing 0, so that 0 is written into the first FeFET in the bit cell, and the fifth voltage range is a voltage range for writing 1, so that 1 is written into the second FeFET in the bit cell. In this way, when the first FeFET is a dominant FeFET, data stored in the bit cell is 0. Likewise, during writing 1 into the bit cell of the $X^{th}$ row and the $Y^{th}$ column, the fourth voltage range is a voltage range for writing 1, so that 1 is written into the first FeFET in the bit cell, and the fifth voltage range is a voltage range for writing 0, so that 0 is written into the second FeFET in the bit cell. In this way, when the first FeFET is a dominant FeFET, data stored in the bit cell is 1.

In the method for writing data into the CAM provided in an embodiment of the application, each bit cell in the CAM includes only two FeFET transistors. In this method, a value is written by using a bit line connected to a gate. Compared with a data write method in the prior art, the method can reduce power consumption of writing data because the CAM includes only two FeFET transistors, and a size of the CAM is relatively small.

Table search in a network device is performed by using a search algorithm. The search algorithm is usually performed for multi-level nodes or a plurality of nodes. Exact search usually needs to be performed for nodes at a level or a node. Conventionally, all data of the level or the node is read from a memory through memory reading, and then a logic circuit completes matching. This practice is very time-consuming and occupies memory bandwidth. Table search in a network device is performed by using the content addressable memory provided in the embodiments of this application. For table search for a level or a node, a search hit inside an algorithm node can be directly completed in a memory, and only a hit part is returned, thereby saving memory bandwidth and greatly reducing a search delay. Common table search algorithms include longest prefix match (LPM), mask match, and exact match (EM).

For example, in a search algorithm of LPM, the LPM includes a five-level processing process. In a conventional table search algorithm, a processing process of each level is as follows: Data is read from a memory, and a logic circuit is used to search many entries for an entry matching a given match value (key). According to the method provided in the embodiments of this application, a CAM can be directly used to complete entry searching and matching in a memory, so that a result is directly returned from the memory, and a process of searching by using a logic circuit is omitted.

For another example, search based on mask match includes multi-level processing, and processing at the last level is to search a specified container for a matching rule. In a conventional algorithm, all data is read from a memory, and then a logic circuit is used to search the data for the matching rule. According to the method provided in the embodiments of this application, the matching rule can be directly found from the specified container during processing at the last level, and a result can be directly returned from a memory.

For still another example, search based on exact match includes a plurality of levels. In a conventional search algorithm, data is read from a memory, and then a logic circuit is used to search the data for matching data. According to the method provided in the embodiments of this application, search can be directly completed in a memory and a result can be returned from the memory.

The content addressable memory provided in the embodiments of this application is applied to a network device. The network device may be any device configured to transmit a data packet through a network. For example, the network device may be a device such as a switching device or a router.

Figure 10:
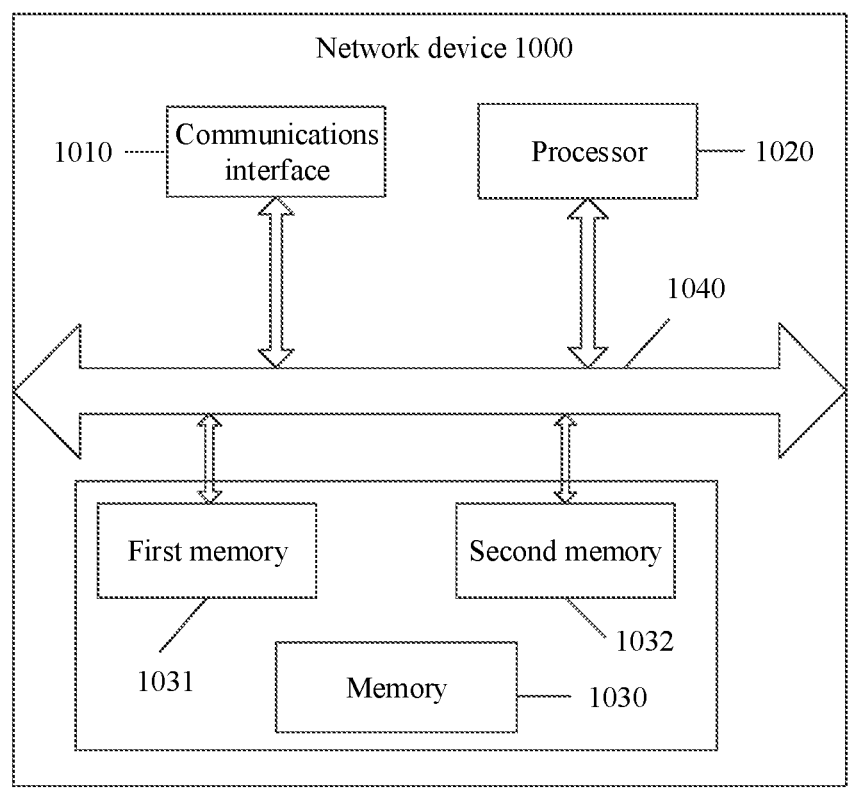
FIG. 10 is a schematic structural diagram of a network device according to an embodiment of this application.

FIG. 10 is a schematic structural diagram of a network device according to an embodiment of this application. The network device 1000 includes a communications interface 1010, a processor 1020, a memory 1030, and a bus 1040. The communications interface 1010, the processor 1020, and the memory 1030 communicate with each other by using the bus 1040. The memory 1030 includes a first memory 1031 and a second memory 1032. The second memory 1032 may be the CAM provided in the embodiments of this application.

The network device 1000 communicates with another device by using the communications interface 1010. For example, the network device 1000 receives, by using the communications interface 1010, a packet sent by another device or sends a packet to another device. For example, the communications interface 1010 includes an ingress media access control (MAC) chip and an egress MAC chip. The network device 1000 may receive a packet by using an ingress MAC chip, and send a packet by using an egress MAC chip.

The processor 1020 may be a central processing unit (CPU), or an application-specific integrated circuit (ASIC), or one or more integrated circuits configured to implement the embodiments of this application. For example, the processor 1020 is a complementary metal oxide semiconductor (CMOS) logic circuit, and the processor 1020 is configured to execute executable program code stored in the first memory 1031, for example, a computer program, to run a program corresponding to the executable code.

The memory 1031 is configured to store executable program code, where the program code includes a computer operation instruction. The memory 1031 may include a high-speed random access memory (RAM) memory, or may be a non-volatile memory, for example, at least one magnetic disk memory.

The second memory 1032 may be the CAM provided in the embodiments of this application, for example, may be a TCAM.

The bus 1040 may be an industry standard architecture (ISA) bus, a peripheral component interconnect (PCI) bus, an extended industry standard architecture (EISA) bus, or the like. The bus 1040 may be classified into an address bus, a data bus, a control bus, and the like.

For ease of representation, only one thick line is used to represent the bus in FIG. 10, but this does not mean that there is only one bus or only one type of bus.

With reference to the network device shown in FIG. 10, the method provided in an embodiment of the application may be implemented as follows: The network device 1000 receives a data packet through the communications interface 1010, and sends the data packet to the processor 1020, after the processor 1020 performs preprocessing, the second memory 1032 performs processes of operations S301 to S304 shown in FIG. 3, S401 to S404 shown in FIG. 4, S501 to S502 shown in FIG. 5, S601 to S604 shown in FIG. 6, and S701 to S704 shown in FIG. 7. Alternatively, the second memory 8032 directly performs processes of operations S301 to S304 shown in FIG. 3, S401 to S404 shown in FIG. 4, S501 to S502 shown in FIG. 5, S601 to S604 shown in FIG. 6, S701 to S704 shown in FIG. 7, S801 to S804 shown in FIG. 8, and S901 to S904 shown in FIG. 9.

The foregoing descriptions are merely embodiments of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A content addressable memory CAM, comprising:
   a plurality of bit units arranged in M rows and N columns, wherein both M and N are positive integers greater than or equal to 1; wherein each bit unit comprises a first ferro-electric field effect transistor (FeFET) and a second FeFET; wherein a source of the first FeFET is connected to a drain of the second FeFET; and wherein a source of the second FeFET is grounded; and
   an entry comprising data stored in bit cells of a column in the CAM, wherein bit cells of a same column correspond to a same match line, wherein the bit cells of a same column separately correspond to a same first back gate line and a same second back gate line, wherein a drain of a first FeFET in each bit cell of a same column is connected to a match line corresponding to the same column, wherein bit cells of a same row correspond to a same first bit line and a same second bit line, wherein a gate of a first FeFET in each bit cell of a same row is connected to a first bit line corresponding to the same row, and wherein a gate of a second FeFET in each bit cell of a same row is connected to a second bit line corresponding to the same row.

2. The CAM according to claim 1, wherein:
   a back gate of the first FeFET in each bit cell of the same column is connected to a first back gate line corresponding to the column, and wherein a back gate of a second FeFET in each bit cell of a same column is connected to a second back gate line corresponding to the same column.

3. A data processing method, applied to a content addressable memory (CAM), comprising:
   setting a first ferro-electric field effect transistor (FeFET) and/or a second FeFET in each bit cell to be always cut off;
   setting voltages of drains of first FeFETs connected to match lines in the CAM as preset voltages;
   inputting a match value by using a first bit line and inputting a reverse value of the match value by using a second bit line, or inputting a match value by using the second bit line and inputting a reverse value of the match value by using the first bit line; and
   if an output voltage of a match line of a target column remains as a preset voltage corresponding to the target column, determining that an entry comprising data stored in bit cells of the target column is a match entry.

4. The data processing method according to claim 3, wherein each FeFET comprises a gate but does not comprise a back gate, and the setting a first FeFET and/or a second FeFET in each bit cell to be always cut off comprises:
   setting a voltage of a gate of the first FeFET connected to the first bit line and/or a voltage of a gate of the second FeFET connected to the second bit line in each bit cell to fall within a first voltage range, so that the first FeFET and/or the second FeFET is always cut off, wherein when a voltage of a gate of a FeFET falls within the first voltage range, the FeFET is cut off; and
   the inputting a match value by using a first bit line and inputting a reverse value of the match value by using a second bit line, or inputting a match value by using the second bit line and inputting a reverse value of the match value by using the first bit line comprises:
   setting a voltage of a gate of a first FeFET connected to a first bit line as a first voltage, and setting a voltage of a gate of a second FeFET connected to a second bit line as a second voltage, wherein a match value is input by using the first bit line and a reverse value of the match value is input by using the second bit line, or a match value is input by using the second bit line and a reverse value of the match value is input by using the first bit line; or
   wherein each FeFET comprises a gate and a back gate, and
   the setting a first FeFET and/or a second FeFET in each bit cell to be always cut off comprises:
   setting a voltage difference between a gate of the first FeFET connected to the first bit line and a back gate of the first FeFET in each bit cell to fall within a first voltage range, and/or setting a voltage difference between a gate of the second FeFET connected to the second bit line and a back gate of the second FeFET in each bit cell to fall within the first voltage range, wherein the first FeFET and/or the second FeFET is always cut off, wherein when a voltage difference between the gate and the back gate of the FeFET falls within the first voltage range, the FeFET is cut off; and
   the inputting a match value by using a first bit line and inputting a reverse value of the match value by using a second bit line, or inputting a match value by using the second bit line and inputting a reverse value of the match value by using the first bit line comprises:
   setting a voltage difference between a gate of the first FeFET connected to the first bit line and a back gate of the first FeFET as a first voltage, and setting a voltage difference between a gate of the second FeFET connected to the second bit line and a back gate of the second FeFET as a second voltage, to input a match value by using the first bit line and input a reverse value of the match value by using the second bit line, or input a match value by using the second bit line and input a reverse value of the match value by using the first bit line.

5. The data processing method according to claim 4, wherein
   if a match value is input by using the first bit line, when the match value is 0, the first voltage falls within a second voltage range, and the second voltage falls within a third voltage range; or when the match value is 1, the first voltage falls within the third voltage range, and the second voltage falls within the second voltage range; and
   if a match value is input by using the second bit line, when the match value is 0, the first voltage falls within the third voltage range, and the second voltage falls within the second voltage range; or when the match value is 1, the first voltage falls within the second voltage range, and the second voltage falls within the third voltage range, wherein
   if a FeFET comprises a gate but does not comprise a back gate, when a voltage of the gate falls within the second voltage range, a match value is input into the FeFET for matching, or when a voltage of the gate falls within the third voltage range, the FeFET is always conducted; or if a FeFET comprises a gate and a back gate, when a voltage difference between the gate and the back gate falls within the second voltage range, a match value is input into the FeFET for matching, or when a voltage difference between the gate and the back gate falls within the third voltage range, the FeFET is always conducted.

6. The data processing method according to claim 3, comprising:
   if at least two match entries exist, outputting a match entry with a smallest storage address as a match result; or
   outputting an entry comprising data stored in bit cells of a target column with a smallest column number as a match result.

7. The data processing method according claim 3, further comprising:
   when an entry matching manner is exact match or mask match and a mask of a bit cell is 1, writing different values into a first FeFET and a second FeFET of a bit cell during writing data into the bit cell; or
   when an entry matching manner is mask match and a mask of a bit cell is 0, writing 0 into both a first FeFET and a second FeFET of a bit cell during writing data into the bit cell.

8. The data processing method according to claim 7, wherein each FeFET comprises a gate and a back gate, and
   the writing different values into a first FeFET and a second FeFET of a bit cell during writing data into the bit cell comprises:
   setting a voltage difference between a gate of the first FeFET connected to the first bit line and a back gate of the first FeFET to fall within a fourth voltage range, and setting a voltage difference between a gate of the second FeFET connected to the second bit line and a back gate of the second FeFET to fall within a fifth voltage range, so that different values are written into the first FeFET and the second FeFET, wherein the fourth voltage range and the fifth voltage range are different; and
   the writing 0 into both a first FeFET and a second FeFET comprises:
   setting a voltage difference between a gate of the first FeFET connected to the first bit line and a back gate of the first FeFET and a voltage difference between a gate of the second FeFET connected to the second bit line and a back gate of the second FeFET to fall within a same voltage range, so that values written into the first FeFET and the second FeFET are 0.

9. The data processing method according to claim 8, wherein each FeFET comprises a gate and a back gate, and the method further comprises:
   during writing data into a bit cell of an $X^{th}$ row and a $Y^{th}$ column in the CAM, setting a voltage of a gate of a first FeFET connected to the first bit line of the $X^{th}$ row as a first write voltage, setting a voltage of a gate of a second FeFET connected to the second bit line of the $X^{th}$ row as a second write voltage, setting a voltage of a gate of a first FeFET connected to the first bit line of another row as a third write voltage, and setting a voltage of a gate of a second FeFET connected to the second bit line of the another rows as a fourth write voltage; and
   setting a voltage of a back gate of a first FeFET connected to a first back gate line of the $Y^{th}$ column as a fifth write voltage, setting a voltage of a back gate of a second FeFET connected to a second back gate line of the $Y^{th}$ column as a sixth write voltage, setting a voltage of a back gate of a first FeFET connected to a first back gate line of another column as a seventh write voltage, and setting a voltage of a back gate of a second FeFET connected to a second back gate line of the another columns as an eighth write voltage.

10. The data processing method according to claim 9, wherein a difference between the first write voltage and the fifth write voltage falls within the fourth voltage range, and a difference between the second write voltage and the sixth write voltage falls within the fifth voltage range, so that data is written only into the bit cell of the $X^{th}$ row and the $Y^{th}$ column; and
   wherein a difference between the third write voltage and the fifth write voltage, a difference between the fourth write voltage and the sixth write voltage, a difference between the third write voltage and the seventh write voltage, a difference between the fourth write voltage and the eighth write voltage, a difference between the first write voltage and the seventh write voltage, and a difference between the second write voltage and the eighth write voltage fall within a sixth voltage range, so that no data is written into another bit cell.

11. The data processing method according to claim 7, wherein each FeFET comprises a gate but does not comprise a back gate, and
   the writing different values into a first FeFET and a second FeFET of a bit cell during writing data into the bit cell comprises:
   setting a voltage of a gate of the first FeFET connected to the first bit line to fall within a fourth voltage range, and setting a voltage of a gate of the second FeFET connected to the second bit line to fall within a fifth voltage range, so that different values are written into the first FeFET and the second FeFET, and the fourth voltage range and the fifth voltage range are different; and
   wherein the writing 0 into both a first FeFET and a second FeFET comprises:
   setting a voltage of a gate of the first FeFET connected to the first bit line and a gate of the second FeFET connected to the second bit line to fall within a same voltage range, so that values written into the first FeFET and the second FeFET are 0.

12. The data processing method according to claim 11, wherein each FeFET comprises a gate but does not comprise a back gate, a switch is disposed between the gate of the first FeFET in each bit unit and the first bit line connected to the gate, and a switch is disposed between the gate of the second FeFET in each bit unit and the second bit line connected to the gate, and wherein the method further comprises:
   during writing data into a bit cell of an $X^{th}$ row and a $Y^{th}$ column in the CAM, setting a switch between a gate of a first FeFET in the bit cell of the $X^{th}$ row and the $Y^{th}$ column and a connected first bit line to be closed, and setting a switch between a gate of a second FeFET in the bit cell of the $X^{th}$ row and the $Y^{th}$ column and a connected second bit line to be closed; and setting a switch between a gate of a first FeFET in another bit cell of the $X^{th}$ row and a connected first bit line to be open, and setting a switch between a gate of a second FeFET in the another bit cell of the $X^{th}$ row and a connected second bit line to be open; and
   setting a voltage of a gate of a first FeFET connected to the first bit line of the $X^{th}$ row as a first write voltage, setting a voltage of a gate of a second FeFET connected to the second bit line of the $X^{th}$ row as a second write voltage, setting a voltage of a gate of a first FeFET connected to a first bit line of another row as a third write voltage, and setting a voltage of a gate of a second FeFET connected to a second bit line of the another row as a fourth write voltage, wherein the first write voltage falls within a fourth voltage range, and the second write voltage falls within a fifth voltage range, so that data is written only into the bit cell of the $X^{th}$ row and the $Y^{th}$ column; and the third write voltage and the fourth write voltage fall within a sixth voltage range, so that no data is written into bit cells other than the bit cell of the $X^{th}$ row and the $Y^{th}$ column.

13. A network device, comprising:

a processor, a communications interface, a first memory, a second memory, and a communications bus, wherein the processor, the communications interface, the first memory, and the second memory communicate with each other by using the communications bus; and the first memory stores computer executable program code, and the second memory is a content addressable memory (CAM), the CAM comprising:

a plurality of bit units arranged in M rows and N columns, wherein both M and N are positive integers greater than or equal to 1; wherein each bit unit comprises a first ferro-electric field effect transistor (FeFET) and a second FeFET; wherein a source of the first FeFET is connected to a drain of the second FeFET; and wherein a source of the second FeFET is grounded; and an entry comprising data stored in bit cells of a column in the CAM, wherein bit cells of a same column correspond to a same match line, wherein the bit cells of a same column separately correspond to a same first back gate line and a same second back gate line, wherein a drain of a first FeFET in each bit cell of a same column is connected to a match line corresponding to the same column, wherein bit cells of a same row correspond to a same first bit line and a same second bit line, wherein a gate of a first FeFET in each bit cell of a same row is connected to a first bit line corresponding to the same row, and wherein a gate of a second FeFET in each bit cell of a same row is connected to a second bit line corresponding to the same row.

14. The network device according to claim 13, wherein a back gate of the first FeFET in each bit cell of the same column is connected to a first back gate line corresponding to the column, and wherein a back gate of a second FeFET in each bit cell of a same column is connected to a second back gate line corresponding to the same column.

15. The network device according to claim 13, wherein the processor is configured to execute the computer executable program code stored in the first memory to perform operations, the operations comprising:

setting a first ferro-electric field effect transistor (FeFET) and/or a second FeFET in each bit cell to be always cut off;

setting voltages of drains of first FeFETs connected to match lines in the CAM as preset voltages;

inputting a match value by using a first bit line and inputting a reverse value of the match value by using a second bit line, or inputting a match value by using the second bit line and inputting a reverse value of the match value by using the first bit line; and if an output voltage of a match line of a target column remains as a preset voltage corresponding to the target column, determining that an entry comprising data stored in bit cells of the target column is a match entry.

16. The network device according to claim 15, wherein each FeFET comprises a gate but does not comprise a back gate, and the setting a first FeFET and/or a second FeFET in each bit cell to be always cut off comprises:

setting a voltage of a gate of the first FeFET connected to the first bit line and/or a voltage of a gate of the second FeFET connected to the second bit line in each bit cell to fall within a first voltage range, so that the first FeFET and/or the second FeFET is always cut off, wherein when a voltage of a gate of a FeFET falls within the first voltage range, the FeFET is cut off; and the inputting a match value by using a first bit line and inputting a reverse value of the match value by using a second bit line, or inputting a match value by using the second bit line and inputting a reverse value of the match value by using the first bit line comprises:

setting a voltage of a gate of a first FeFET connected to a first bit line as a first voltage, and setting a voltage of a gate of a second FeFET connected to a second bit line as a second voltage, wherein a match value is input by using the first bit line and a reverse value of the match value is input by using the second bit line, or a match value is input by using the second bit line and a reverse value of the match value is input by using the first bit line; or wherein each FeFET comprises a gate and a back gate, and the setting a first FeFET and/or a second FeFET in each bit cell to be always cut off comprises:

setting a voltage difference between a gate of the first FeFET connected to the first bit line and a back gate of the first FeFET in each bit cell to fall within a first voltage range, and/or setting a voltage difference between a gate of the second FeFET connected to the second bit line and a back gate of the second FeFET in each bit cell to fall within the first voltage range, wherein the first FeFET and/or the second FeFET is always cut off, wherein when a voltage difference between the gate and the back gate of the FeFET falls within the first voltage range, the FeFET is cut off; and the inputting a match value by using a first bit line and inputting a reverse value of the match value by using a second bit line, or inputting a match value by using the second bit line and inputting a reverse value of the match value by using the first bit line comprises:

setting a voltage difference between a gate of the first FeFET connected to the first bit line and a back gate of the first FeFET as a first voltage, and setting a voltage difference between a gate of the second FeFET connected to the second bit line and a back gate of the second FeFET as a second voltage, to input a match value by using the first bit line and input a reverse value of the match value by using the second bit line, or input a match value by using the second bit line and input a reverse value of the match value by using the first bit line.

17. The network device according to claim 16, wherein if a match value is input by using the first bit line, when the match value is 0, the first voltage falls within a second voltage range, and the second voltage falls within a third voltage range; or when the match value is 1, the first voltage falls within the third voltage range, and the second voltage falls within the second voltage range; and if a match value is input by using the second bit line, when the match value is 0, the first voltage falls within the third voltage range, and the second voltage falls within the second voltage range; or when the match value is 1, the first voltage falls within the second voltage range, and the second voltage falls within the third voltage range, wherein if a FeFET comprises a gate but does not comprise a back gate, when a voltage of the gate falls within the second voltage range, a match value is input into the FeFET for matching, or when a voltage of the gate falls within the third voltage range, the FeFET is always conducted; or if a FeFET comprises a gate and a back gate, when a voltage difference between the gate and the back gate falls within the second voltage range, a match value is input into the FeFET for matching, or when a voltage difference between the gate and the back gate falls within the third voltage range, the FeFET is always conducted.

18. The network device according to claim 15, wherein the operations further comprise:

if at least two match entries exist, outputting a match entry with a smallest storage address as a match result; or outputting an entry comprising data stored in bit cells of a target column with a smallest column number as a match result.

19. The network device according claim 15, wherein the operations further comprise:

when an entry matching manner is exact match or mask match and a mask of a bit cell is 1, writing different values into a first FeFET and a second FeFET of a bit cell during writing data into the bit cell; or when an entry matching manner is mask match and a mask of a bit cell is 0, writing 0 into both a first FeFET and a second FeFET of a bit cell during writing data into the bit cell.

20. The network device according to claim 19, wherein each FeFET comprises a gate and a back gate, and the writing different values into a first FeFET and a second FeFET of a bit cell during writing data into the bit cell comprises:

setting a voltage difference between a gate of the first FeFET connected to the first bit line and a back gate of the first FeFET to fall within a fourth voltage range, and setting a voltage difference between a gate of the second FeFET connected to the second bit line and a back gate of the second FeFET to fall within a fifth voltage range, so that different values are written into the first FeFET and the second FeFET, wherein the fourth voltage range and the fifth voltage range are different; and the writing 0 into both a first FeFET and a second FeFET comprises:

setting a voltage difference between a gate of the first FeFET connected to the first bit line and a back gate of the first FeFET and a voltage difference between a gate of the second FeFET connected to the second bit line and a back gate of the second FeFET to fall within a same voltage range, so that values written into the first FeFET and the second FeFET are 0.

* * * * *